(12) United States Patent
Ahn et al.

(10) Patent No.: US 12,096,672 B2
(45) Date of Patent: Sep. 17, 2024

(54) DISPLAY DEVICE INCLUDING AN OPTICAL FILTER AND A COLOR FILTER

(71) Applicant: Samsung Display Co., Ltd., Yongin-Si (KR)

(72) Inventors: Jeaheon Ahn, Hwaseong-si (KR); Jangsoo Kim, Asan-si (KR); Jae Cheol Park, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 295 days.

(21) Appl. No.: 17/230,925

(22) Filed: Apr. 14, 2021

(65) Prior Publication Data

US 2022/0005875 A1    Jan. 6, 2022

(30) Foreign Application Priority Data

Jul. 3, 2020 (KR) .......................... 10-2020-0082099

(51) Int. Cl.
| | |
|---|---|
| *H10K 59/38* | (2023.01) |
| *H10K 50/844* | (2023.01) |
| *H10K 50/86* | (2023.01) |
| *H10K 59/12* | (2023.01) |
| *H10K 59/122* | (2023.01) |
| *H10K 71/00* | (2023.01) |

(52) U.S. Cl.
CPC .......... *H10K 59/38* (2023.02); *H10K 50/844* (2023.02); *H10K 71/00* (2023.02); *H10K 50/865* (2023.02); *H10K 59/1201* (2023.02); *H10K 59/122* (2023.02)

(58) Field of Classification Search
CPC ............. H10K 50/813; H10K 50/822; H10K 59/353; H10K 59/352; H10K 59/38
USPC ...................................................... 257/40, 72
See application file for complete search history.

(56) References Cited

U.S. PATENT DOCUMENTS

| | | | |
|---|---|---|---|
| 10,073,294 | B1 | 9/2018 | Lin et al. |
| 10,658,435 | B2 * | 5/2020 | Lin ...................... H10K 50/865 |
| 2005/0008770 | A1 | 1/2005 | Kawase |
| 2017/0076678 | A1 * | 3/2017 | Lee ........................ G02F 1/1336 |
| 2017/0250377 | A1 * | 8/2017 | Tokuda ................ H10K 50/865 |
| 2018/0059301 | A1 * | 3/2018 | An ..................... G02F 1/133528 |
| 2018/0197922 | A1 * | 7/2018 | Song .................... H10K 50/805 |
| 2018/0341147 | A1 * | 11/2018 | Sugitani ............ G02F 1/133617 |
| 2019/0006430 | A1 | 1/2019 | Jun et al. |
| 2019/0094624 | A1 * | 3/2019 | Kim .................. G02F 1/133617 |
| 2020/0041837 | A1 * | 2/2020 | Jiang ................. G02F 1/133609 |

* cited by examiner

*Primary Examiner* — Nduka E Ojeh
(74) *Attorney, Agent, or Firm* — Innovation Counsel LLP

(57) ABSTRACT

A display device may include a first transistor, a second transistor, a first electrode, a second electrode, a first optical filter, and a second optical filter. No intervening transistor may be positioned between the first transistor and the second transistor. The first electrode may be electrically connected to the first transistor. The second electrode may be electrically connected to the second transistor. The first optical filter may overlap the first electrode and may have a first circular perimeter in a plan view of the display device. The second optical filter may overlap the second electrode, may have a polygonal perimeter in the plan view of the display device, and may be spaced from the first optical filter.

21 Claims, 34 Drawing Sheets

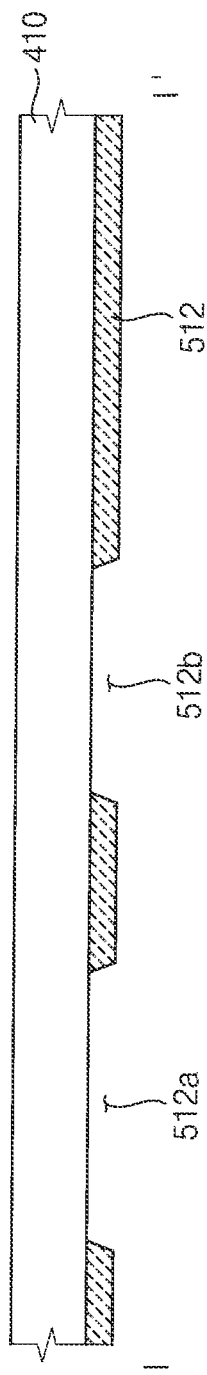
FIG. 13
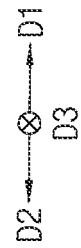

FIG. 14
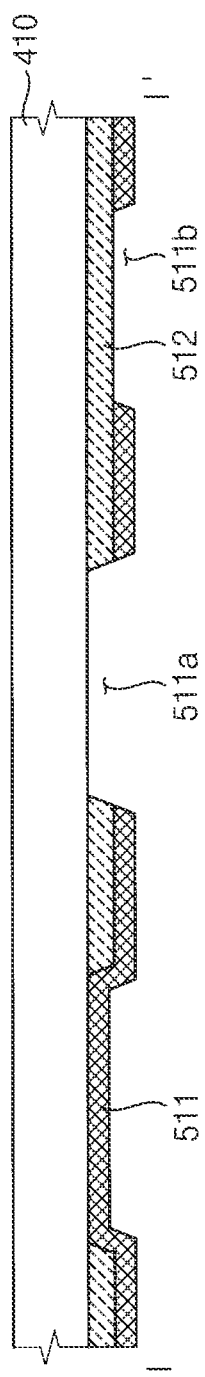
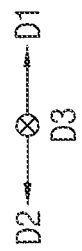

DISPLAY DEVICE INCLUDING AN OPTICAL FILTER AND A COLOR FILTER

CROSS-REFERENCE TO RELATED APPLICATION

This application claims priority under 35 USC § 119 to Korean Patent Application No. 10-2020-0082099 filed on Jul. 3, 2020 in the Korean Intellectual Property Office (KIPO); the Korean Patent Application is incorporated by reference.

BACKGROUND

1. Field

The technical field relates to a display device.

2. Description of the Related Art

Display devices may display images according to input signals. Modern display devices include liquid crystal display devices and organic light emitting diode display devices.

A display device may include components that may undesirably block light. For attaining satisfactory image quality and/or energy efficiency of the display device, the undesirably blocked light should be minimized.

SUMMARY

Some embodiments may be related a display device that includes an optical filter and a color filter.

According to embodiments, a display device includes a first substrate, a pixel structure, a first optical filter, and a second optical filter. The pixel structure is disposed on the first substrate. The first optical filter has a circular shape, and is disposed on the pixel structure. The second optical filter has a polygonal shape, and is disposed on the pixel structure while being spaced apart from the first optical filter.

In embodiments, when viewed in a plan view of the display device, an area of the first optical filter may be larger than an area of the second optical filter.

In embodiments, the display device may further include a third optical filter disposed on the pixel structure while being spaced apart from each of the first and second optical filters, and the third optical filter may have a circular shape when viewed in a plan view.

In embodiments, when viewed in a plan view of the display device, an area of the third optical filter may be larger than an area of the second optical filter.

In embodiments, the second optical filter may be configured to transmit a first color. The first optical filter may be configured to convert the first color into a second color. The third optical filter may be configured to convert the first color into a third color.

In embodiments, the pixel structure may be configured to emit the first color.

In embodiments, the display device may further include a light blocking member disposed on the pixel structure, and the light blocking member may include a first opening having a circular shape when viewed in a plan view and a second opening having a rectangular shape when viewed in a plan view.

In embodiments, the first optical filter may be disposed in the first opening, and the second optical filter may be disposed in the second opening.

In embodiments, when viewed in a plan view of the display device, an area of the first opening may be larger than an area of the second opening.

In embodiments, a part of the second optical filter may be disposed on a bottom surface of the light blocking member.

In embodiments, a level of a bottom surface of the first optical filter and a level of a bottom surface of the second optical filter may be different from each other.

In embodiments, the display device may further include a first protective insulating layer disposed on a bottom surface of the light blocking member.

In embodiments, the first protective insulating layer may be disposed on a bottom surface of the first optical filter without being disposed on a bottom surface of the second optical filter.

In embodiments, the first protective insulating layer may be disposed inside the second opening without being disposed inside the first opening.

In embodiments, the display device may further include a second substrate disposed on the first and second optical filters, a first color filter disposed between the second substrate and the first optical filter, and a second color filter disposed between the second substrate and the second optical filter.

In embodiments, the second color filter may overlap the second optical filter on a bottom surface of the second substrate, and may include an opening that overlaps a portion where the first optical filter is disposed.

In embodiments, the first color filter may be disposed in the opening of the second color filter, and may include an opening that overlaps a portion where the second optical filter is disposed under the second color filter.

In embodiments, the display device may further include a second protective insulating layer disposed between the first and second color filters and the first and second optical filters.

In embodiments, the first protective insulating layer and the second protective insulating layer may be spaced apart from each other by the first optical filter, and may make contact with each other between the second color filter and the second optical filter.

In embodiments, the pixel structure may include a first lower electrode disposed under the first optical filter, a second lower electrode disposed under the second optical filter, a light emitting layer disposed on the first and second lower electrodes, and an upper electrode disposed on the light emitting layer.

In embodiments, the first lower electrode may have a circular shape when viewed in a plan view, and the second lower electrode may have a rectangular shape when viewed in a plan view.

In embodiments, when viewed in a plan view of the display device, the first optical filter and the first lower electrode may overlap each other, and the second optical filter and the second lower electrode may overlap each other.

In embodiments, when viewed in a plan view of the display device, an area of the first lower electrode may be larger than an area of the second lower electrode.

In embodiments, the first optical filter may be formed by using an inkjet process, and the second optical filter may be formed by using a photolithography process.

An embodiment may be related to a display device. The display device may include a first transistor, a second transistor, a first electrode, a second electrode, a first optical filter, and a second optical filter. No intervening transistor may be positioned between the first transistor and the second transistor. The first electrode may be electrically connected to the first transistor. The second electrode may be electrically connected to the second transistor. The first optical filter may overlap the first electrode and may have a first circular perimeter in a plan view of the display device. The second optical filter may overlap the second electrode, may have a polygonal perimeter in the plan view of the display device, and may be spaced from the first optical filter.

An area of the first optical filter may be larger than an area of the second optical filter in the plan view of the display device.

The display device may include a third transistor, a third electrode, and a third optical filter. No intervening transistor may be positioned between the second transistor and the third transistor. The third electrode may be electrically connected to the third transistor. The third optical filter may overlap the third electrode, may be spaced from each of the first optical filter and the second optical filter, and may have a second circular perimeter in the plan view of the display device.

An area of the third optical filter may be larger than an area of the second optical filter in the plan view of the display device.

The second optical filter may transmit first light of a first color. The first optical filter may convert second light of the first color into light of a second color. The third optical filter may convert third light of the first color into light of a third color. The first color, the second color, and the third color may be different from each other.

A pixel of the display device may include the first optical filter, the second optical filter, and the third optical filter. The pixel may emit fourth light of the first color.

The display device may include a light blocking member. The light blocking member may include at least one opening. At least one of the first optical filter and the second optical filter may be at least partially disposed inside the at least one opening.

The at least one opening may include a first opening and a second opening. The first optical filter may be at least partially disposed inside the first opening. The second optical filter may be at least partially disposed inside the second opening.

An area of the first opening may be larger than an area of the second opening in the plan view of the display device.

The light blocking member may include a light blocking section positioned between the first opening and the second opening. A part of the second optical filter may be disposed outside the second opening and may overlap the light blocking section.

The display device may include a substrate. Each of the first optical filter and the second optical filter may overlap the substrate. A face of the first optical filter may face the substrate. A face of the second optical filter may face the substrate and may be positioned closer to or farther from the substrate than the face of the first optical filter is.

The display device may include a first substrate and a first protective insulating layer. Each of the first optical filter and the second optical filter may overlap the substrate. A face of the light blocking member may face the first substrate and may directly contact the first protective insulating layer.

A section of the first protective insulating layer may be disposed between the first optical filter and the substrate and may directly contact the first optical filter. No section of the first protective insulating layer is disposed between the second optical filter and the first substrate in a direction perpendicular to the first substrate and overlaps the second optical filter.

The first protective insulating layer may be partially disposed inside the second opening.

The display device may include the following elements: a second substrate overlapping each of the first optical filter and the second optical filter; a first color filter disposed between the second substrate and the first optical filter; and a second color filter disposed between the second substrate and the second optical filter.

The second color filter may overlap the second optical filter and may include a first filter opening. The first filter opening may expose a portion of the second substrate. The portion of the second substrate may overlap the first optical filter.

The first color filter may be partially disposed inside the first filter opening and may include a second filter opening. The second filter opening may expose a portion of the second color filter. The portion of the second optical filter may be disposed between the second filter opening and the second substrate.

The display device may include a second protective insulating layer. The second protective insulating layer may be disposed between the first color filter and the first optical filter and may be disposed between the second color filter and second optical filter.

A first section of the first protective insulating layer and a first section the second protective insulating layer may overlap each other and may be spaced from each other by the first optical filter. A second section of the first protective insulating layer and a second section of the second protective insulating layer may directly contact each other and may be positioned between the second color filter and the second optical filter.

The display device may include a light emitting layer and a common electrode. The light emitting layer may overlap each of the first electrode and the second electrode, may be disposed between the first electrode and the first optical filter, and may be disposed between the second electrode and the second optical filter. The common electrode may overlap the light emitting layer, may be disposed between the light emitting layer and the first optical filter, and may be disposed between the light emitting layer and the second optical filter.

The first electrode may have a circular boundary in the plan view of the display device. The second lower electrode may have a polygonal boundary in the plan view of the display device.

In the plan view of the display device, the first circular perimeter may surround the circular boundary, and the polygonal perimeter may surround the polygonal boundary.

An area of the first electrode may be larger than an area of the second electrode in the plan view of the display device.

The first optical filter may include an ink material.

A display device includes first and third optical filters each having a circular shape in a plan view in a plan view of the display device. Since the length of a perimeter of a circle is shorter than the length of the perimeter of a polygon (e.g., an asymmetric polygon) based on a preset area, a light blocking member that accommodates the first and third optical filters may cause a relatively small light loss. A relatively small amount of light emitted from a light emitting layer of the display device may be blocked by the light blocking member. Advantageously, the display device 100 may have satisfactory light transmission efficiency and/or energy efficiency.

In embodiments, a display device includes circular first and third optical filters and rectangular second optical filters. The first openings, second openings, and third openings of a light blocking member that accommodate the first optical filters, second optical filters, and third optical filters may be sufficiently separated from each other, so that sections of the light blocking member may be sufficiently wide. Advantageously, a contact area of the light blocking member may be sufficient, and the light blocking member may be secure and may not be peeled off.

In a method of manufacturing a display device, color filters may overlap each other to form a light blocking member. Therefore, it is unnecessary to add an additional light blocking pattern. Advantageously, the manufacturing cost of the display device may be minimized.

Sections of the color filters that are positioned between openings may be sufficiently wide. Therefore, a process margin of the light blocking member may be sufficient. Advantageously, process defects of the light blocking member may be minimized or substantially prevented.

The second optical filters may be formed using a photolithography process with a negative photoresist that is relatively inexpensive. Advantageously, the manufacturing cost of the display device may be minimized.

BRIEF DESCRIPTION OF THE DRAWINGS

FIG. 9, FIG. 10, FIG. 11, FIG. 12, FIG. 13, FIG. 14, FIG. 15, FIG. 16, FIG. 17, FIG. 18, FIG. 19, and FIG. 20 are cross-sectional views showing structures formed in a method of manufacturing a display device according to embodiments.

DETAILED DESCRIPTION OF EMBODIMENTS

Figure 1:
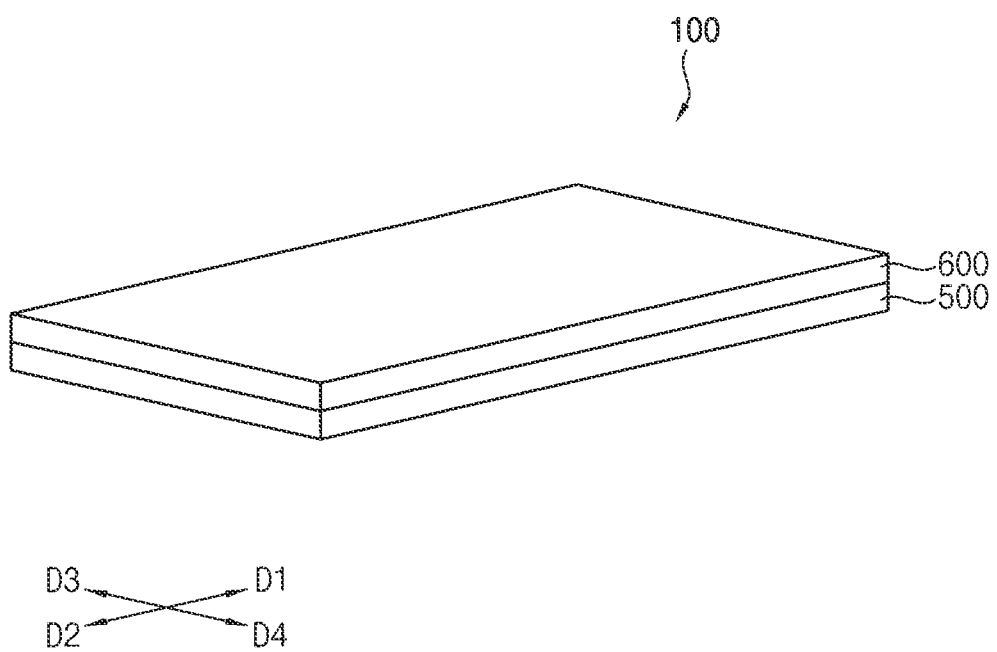
FIG. 1 is a perspective view showing a display device according to embodiments.

Example embodiments are described with reference to the accompanying drawings. Same or similar reference numerals may refer to the same or similar elements.

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

The term "connect" may mean "electrically connect" or "electrically connected through no intervening transistor." The term "insulate" may mean "electrically insulate" or "electrically isolate." The term "conductive" may mean "electrically conductive." The expression "transmit a first color" may mean "transmit light of the first color." The expression "convert a first color to a second color" may mean "convert light of the first color to light of the second color." The terms "lower" and "upper" may indicate two opposite positons without requiring a "lower" element to be below an "upper" element. The terms "bottom" and "top" may indicate two opposite positons without requiring a "bottom" element to be below a "top" element. The term "semiconductor element" may mean "transistor." The term "pattern" may mean "member" or "element." The term "width" may mean "maximum width." The term "distance" may mean "minimum distance." The term "surface" may mean "face." A listing of materials may mean at least one of the listed materials. The expression that an opening overlaps an object may mean that the positioned of the opening overlaps the object and/or that the opening (at least partially) exposes the object.

Figure 2:
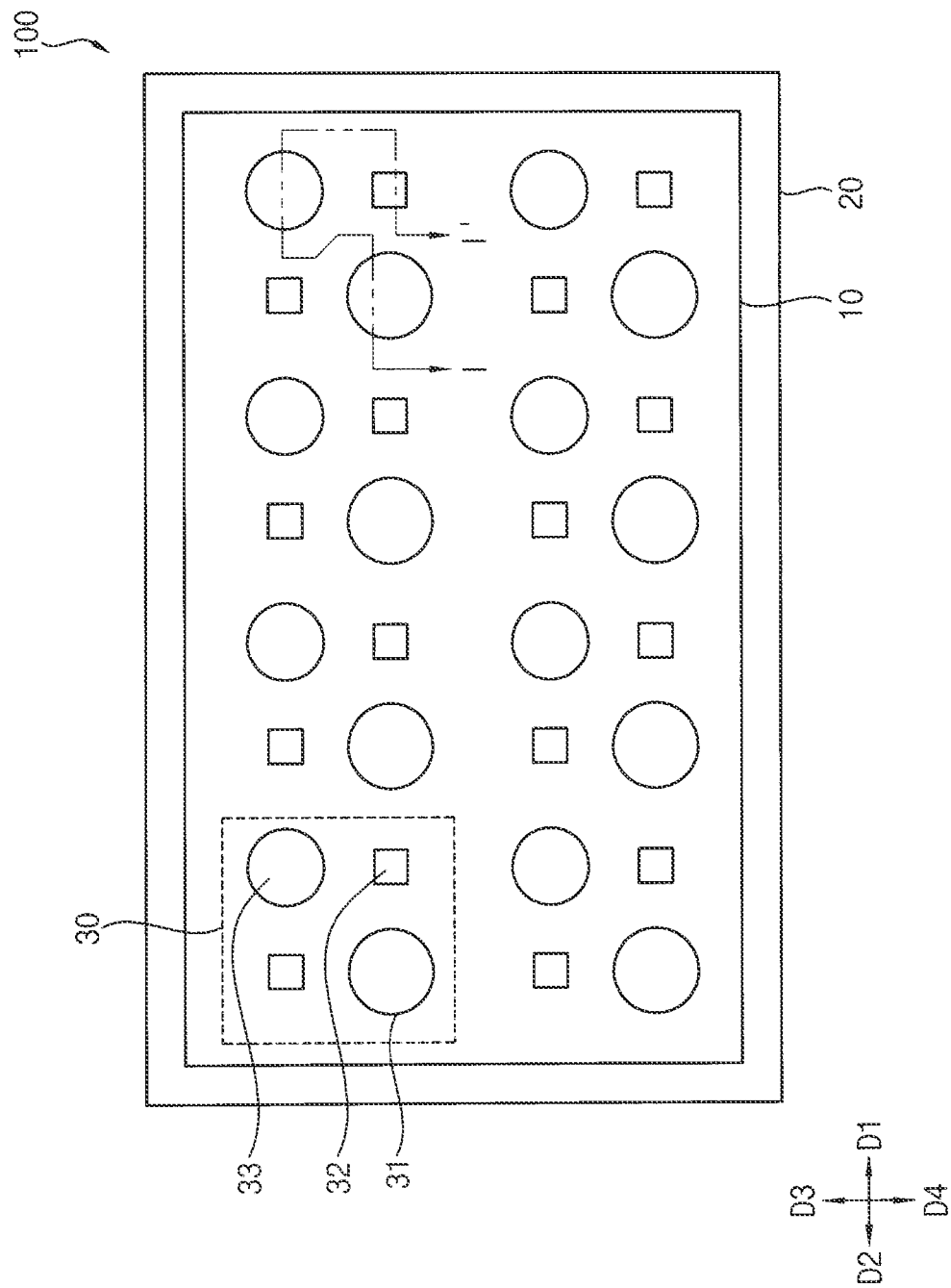
FIG. 2 is a plan view showing the display device of FIG. 1 according to embodiments.
Figure 3:
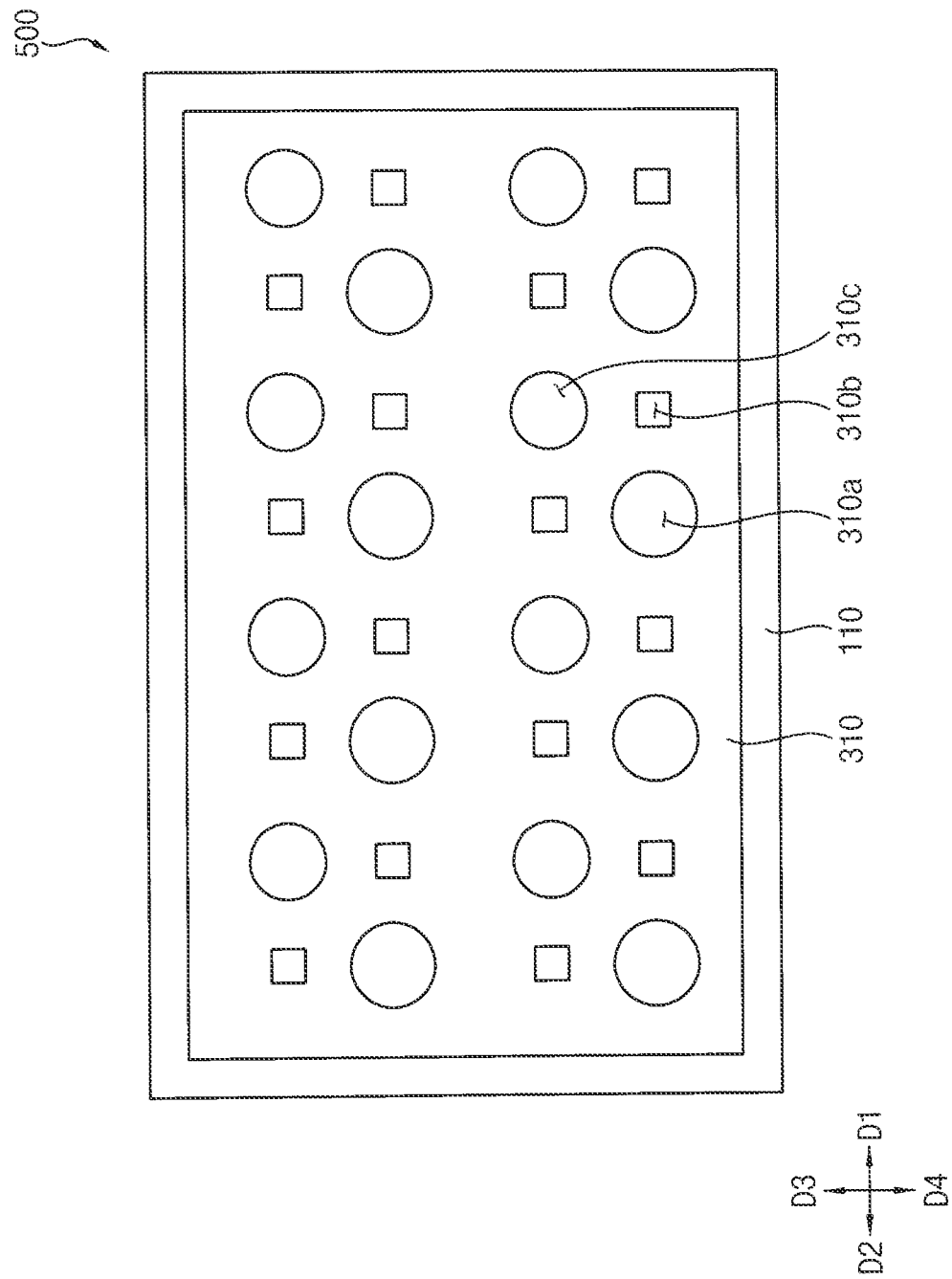
FIG. 3 is a plan view illustrating a pixel defining layer included in the display device of FIG. 1 according to embodiments.
Figure 4:
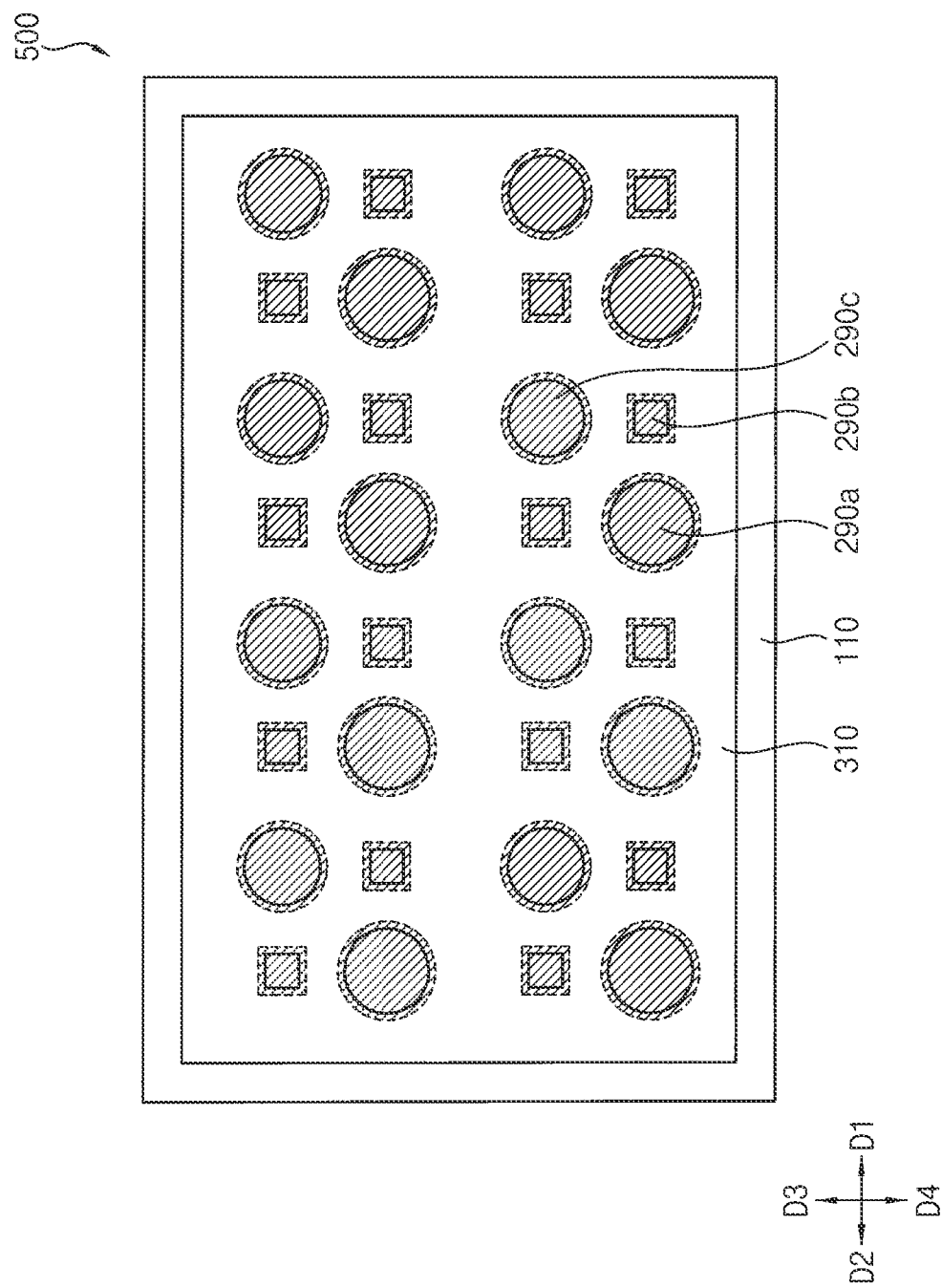
FIG. 4 is a plan view showing the pixel defining layer and a lower electrode included in the display device of FIG. 1 according to embodiments.
Figure 5:
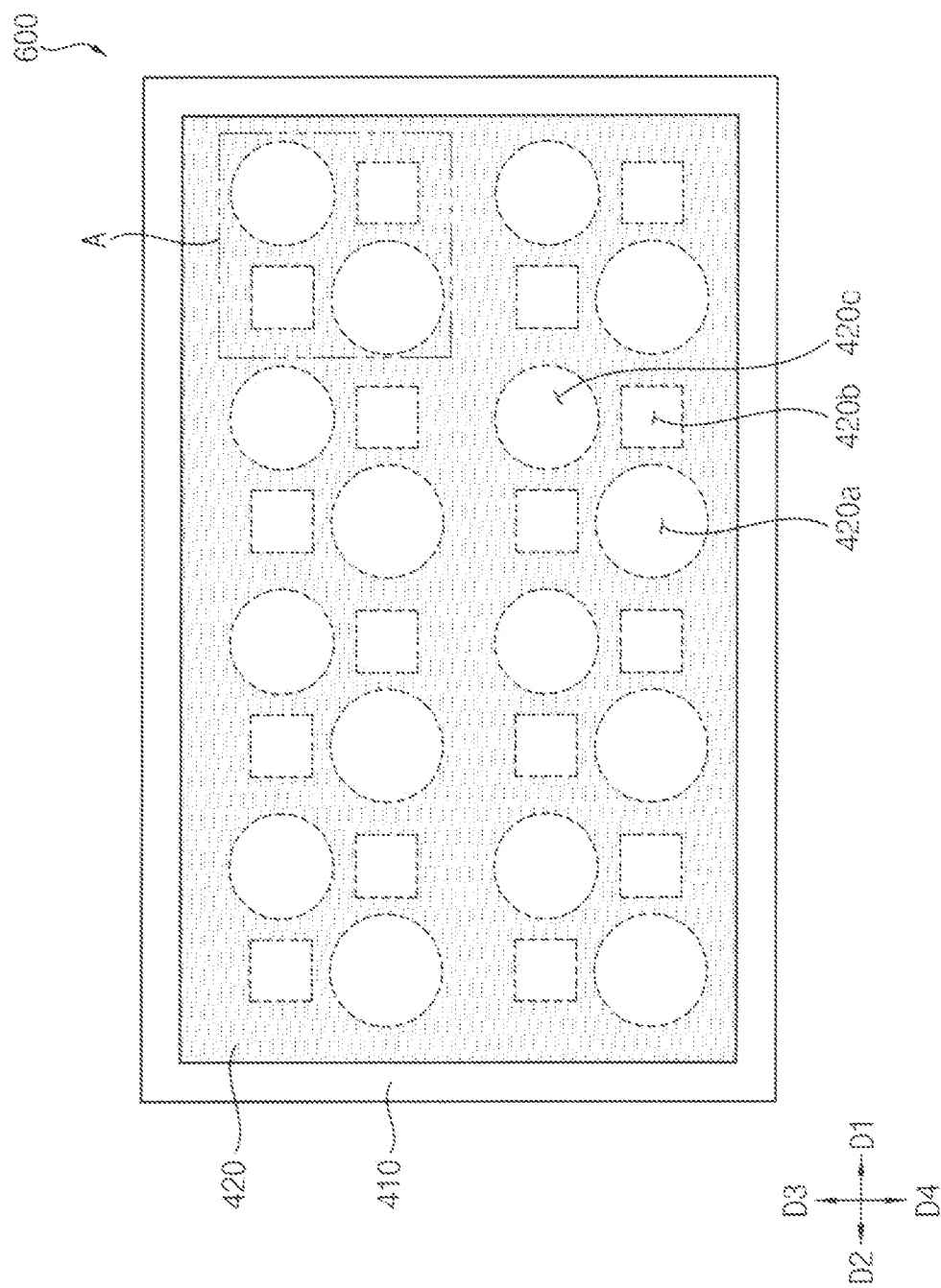
FIG. 5 is a plan view illustrating a light blocking member included in the display device of FIG. 1 according to embodiments.
Figure 6:
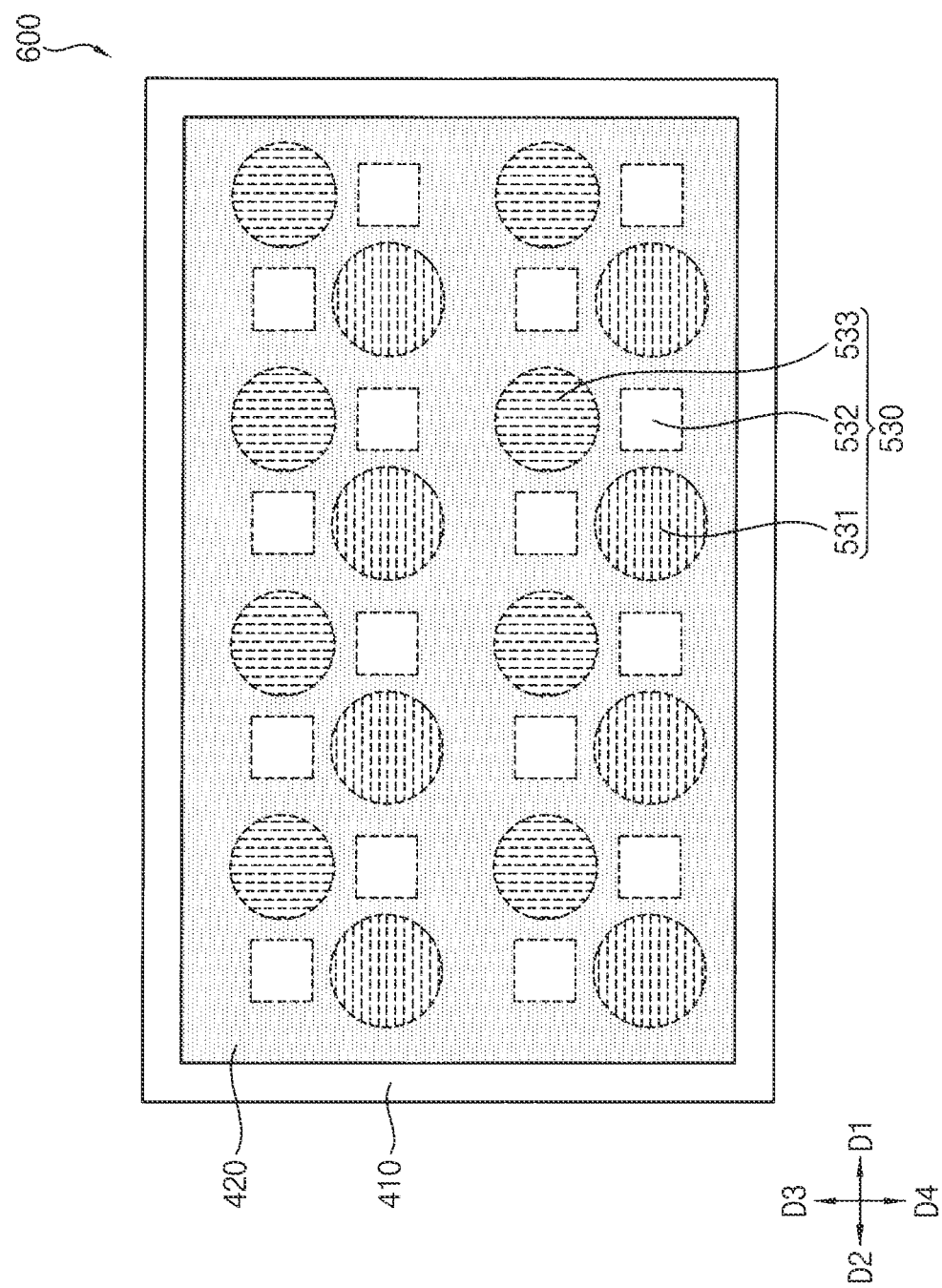
FIG. 6 is a plan view showing the light blocking member, a first optical filter, a second optical filter, and a third optical filter included in the display device of FIG. 1 according to embodiments.

FIG. 1 is a perspective view showing a display device according to embodiments. FIG. 2 is a plan view showing the display device of FIG. 1 according to embodiments. FIG. 3 is a plan view illustrating a pixel defining layer included in the display device of FIG. 1 according to embodiments. FIG. 4 is a plan view showing the pixel defining layer and a lower electrode included in the display device of FIG. 1 according to embodiments. FIG. 5 is a plan view illustrating a light blocking member included in the display device of FIG. 1 according to embodiments. FIG. 6 is a plan view showing the light blocking member, a first optical filter, a second optical filter, and a third optical filter included in the display device of FIG. 1 according to embodiments.

Referring to FIGS. 1, 2, 3, 4, 5, and 6, a display device 100 may include a lower structure 500 and an upper structure 600. The lower structure 500 and the upper structure 600 may make direct contact with each other, and may be hermetically coupled to each other by a sealing member disposed on an outermost periphery of the display device 100. The lower structure 500 and the upper structure 600 may be manufactured independently of each other, and after the upper structure 600 is located on the lower structure 500, the upper structure 600 and the lower structure 500 may be hermetically coupled to each other by the sealing member.

As shown in FIG. 2, the display device 100 may include a display region 10 and a peripheral region 20. The display region 10 may include a plurality of pixel regions 30. The pixel regions 30 may be arranged over the whole display region 10 in the form of a matrix. Each of the pixel regions 30 may include a first sub-pixel region 31, a second sub-pixel region 32, and a third sub-pixel region 33.

In embodiments, in one pixel region 30, the first sub-pixel region 31 and the second sub-pixel region 32 may be located in a first direction D1 parallel to a top surface of the display device 100. The first sub-pixel region 31 may be spaced apart from the second sub-pixel region 32 in a second direction D2 opposite to the first direction D1. The third sub-pixel region 33 may be spaced apart from the second sub-pixel region 32 in a third direction D3 orthogonal to the first direction D1 and the second direction D2. One pixel region 30 may include two second sub-pixel regions 32. One of the two second sub-pixel regions 32 may be spaced apart from the first sub-pixel region 31 in the first direction D1 (and spaced apart from the third sub-pixel region 33 in a fourth direction D4 opposite to the third direction D3, and a remaining one of the two second sub-pixel regions 32 may be spaced apart from the first sub-pixel region 31 in the third direction D3 (and spaced apart from the third sub-pixel region 33 in the second direction D2). In embodiments, a position of the first sub-pixel region 31 and a position of the third sub-pixel region 33 may be interchanged with each other, and the positions of the first sub-pixel region 31 and the third sub-pixel region 33 may be interchanged with the positions of the second sub-pixel regions 32.

In a plan view of the display device 100, an area of the first sub-pixel region 31 may be larger than an area of the second sub-pixel region 32, and an area of the third sub-pixel region 33 may be larger than the area of the second sub-pixel region 32. The area of the first sub-pixel region 31 may be larger than the area of the third sub-pixel region 33. Each of the first and third sub-pixel regions 31 and 33 may have a circular shape in a plan view, and the second sub-pixel region 32 may have a rectangular shape in a plan view. One of the first sub-pixel region 31 and the third sub-pixel region 33 may have a circular shape in a plan view, and a remaining one may have a polygonal shape that is substantially close to a circle in a plan view. One of the first sub-pixel region 31 and the third sub-pixel region 33 may have a circular shape in a plan view, and the remaining one may have a rectangular shape in a plan view.

Pixel structures (including a semiconductor element) may be disposed in the first sub-pixel region 31, the second sub-pixel region 32, and the third sub-pixel region 33 in the display region 10, and a light blocking member may be disposed in a remaining region except for the first sub-pixel region 31, the second sub-pixel region 32, and the third sub-pixel region 33 in the display region 10. The sealing member, signal wires, power wires, and the like may be disposed in the peripheral region 20.

One pixel region 30 may have one second sub-pixel region 32 or at least three second sub-pixel regions 32.

Each of the first sub-pixel region 31 and the third sub-pixel region 33 may have a track shape or an elliptical shape in a plan view.

Each of the display region 10, the peripheral region 20, and the second sub-pixel region 32 may have a triangular shape, a rhombic shape, a polygonal shape, a circular shape, a track shape, or an elliptical shape in a plan view.

As shown in FIGS. 3 and 4, the lower structure 500 may include a first substrate 110; a pixel defining layer 310; first, second, and third pixel electrodes 290a, 290b, and 290c; and the like. The first, second, and third pixel electrodes 290a, 290b, and 290c may be disposed on the first substrate 110, and the pixel defining layer 310 may partially overlap each of the first, second, and third pixel electrodes 290a, 290b, and 290c. The pixel defining layer 310 may partially expose each of the first, second, and third pixel electrodes 290a, 290b, and 290c. The pixel defining layer 310 may include a first circular opening 310a, a rectangular opening 310b, and a second circular opening 310c. The first circular opening 310a may expose a part of the first pixel electrode 290a, the rectangular opening 310b may expose a part of the second pixel electrode 290b, and the second circular opening 310c may expose a part of the third pixel electrode 290c. The first circular opening 310a may correspond to the first sub-pixel region 31, the rectangular opening 310b may correspond to the second sub-pixel region 32, and the second circular opening 310c may correspond to the third sub-pixel region 33. A size of the first circular opening 310a may be substantially the same as a size of the first sub-pixel region 31, a size of the rectangular opening 310b may be substantially the same as a size of the second sub-pixel region 32, and a size of the second circular opening 310c may be substantially the same as a size of the third sub-pixel region 33. The first pixel electrode 290a exposed by the pixel defining layer 310 may correspond to the first sub-pixel region 31, the second pixel electrode 290b exposed by the pixel defining layer 310 may correspond to the second sub-pixel region 32, and the third pixel electrode 290c exposed by the pixel defining layer 310 may correspond to the third sub-pixel region 33.

In a plan view of the display device 100, each of the first pixel electrode 290a and the third pixel electrode 290c may have a circular shape, and the second pixel electrode 290b may have a rectangular shape. One of the first pixel electrode 290a and the third pixel electrode 290c may have a circular shape, and a remaining one may have a polygonal shape that is substantially close to a circle. One of the first pixel electrode 290a and the third pixel electrode 290c may have a circular shape, and the remaining one may have a rectangular shape.

As shown in FIGS. 5 and 6, the upper structure 600 may include a second substrate 410, a light blocking member 420, optical filters 530 including a first optical filter 531, a second optical filter 532, and a third optical filter 533, and the like. The light blocking member 420 may be disposed on a bottom surface of the second substrate 410, and the light blocking member 420 may include a first opening 420a, a second opening 420b, and a third opening 420c.

In a plan view of the display device 100 (or from a direction perpendicular to a top surface of the second substrate 410), each of the first opening 420a and the third opening 420c may have a circular shape, and the second opening 420b may have a rectangular shape. The first optical filter 531 may be disposed in the first opening 420a, the second optical filter 532 may be disposed in the second opening 420b, and the third optical filter 533 may be disposed in the third opening 420c. Since each of the first opening 420a and the third opening 420c has a circular shape, and the second opening 420b has a rectangular shape, each of the first optical filter 531 and the third optical filter 533 may also have a circular shape, and the second optical filter 532 may also have a rectangular shape.

One of the first opening 420a and the third opening 420c may have a circular shape, and a remaining one may have a polygonal shape that is substantially close to a circle. One of the first opening 420a and the third opening 420c may have a circular shape, and the remaining one may have a rectangular shape.

One of the first optical filter 531 and the third optical filter 533 may have a circular shape, and a remaining one may have a polygonal shape that is substantially close to a circle. One of the first optical filter 531 and the third optical filter 533 may have a circular shape, and the remaining one may have a rectangular shape.

In a plan view of the display device 100, an area of the first optical filter 531 (or the first opening 420a) may be larger than an area of the second optical filter 532 (or the second opening 420b), and an area of the third optical filter 533 (or the third opening 420c) may be larger than the area of the second optical filter 532 (or the second opening 420b). The area of the first optical filter 531 (or the first opening 420a) may be larger than the area of the third optical filter 533 (or the third opening 420c).

The first opening 420a, the second opening 420b, and the third opening 420c may overlap (or correspond to) the first sub-pixel region 31 (or the first circular opening 310a), the second sub-pixel region 32 (or the rectangular opening 310b), and the third sub-pixel region 33 (or the second circular opening 310c), respectively, and sizes of the first opening 420a, the second opening 420b, and the third opening 420c may be larger than sizes of the first sub-pixel region 31 (or the first circular opening 310a), the second sub-pixel region 32 (or the rectangular opening 310b), and the third sub-pixel region 33 (or the second circular opening 310c), respectively.

A light emitting layer may be disposed in the first circular opening 310a, the rectangular opening 310b, and the second circular opening 310c of the pixel defining layer 310. Light emitted from the light emitting layer may pass through the optical filters 530 disposed in the first opening 420a, the second opening 420b, and the third opening 420c of the light blocking member 420 to be visible outside the display device 100.

Figure 7:
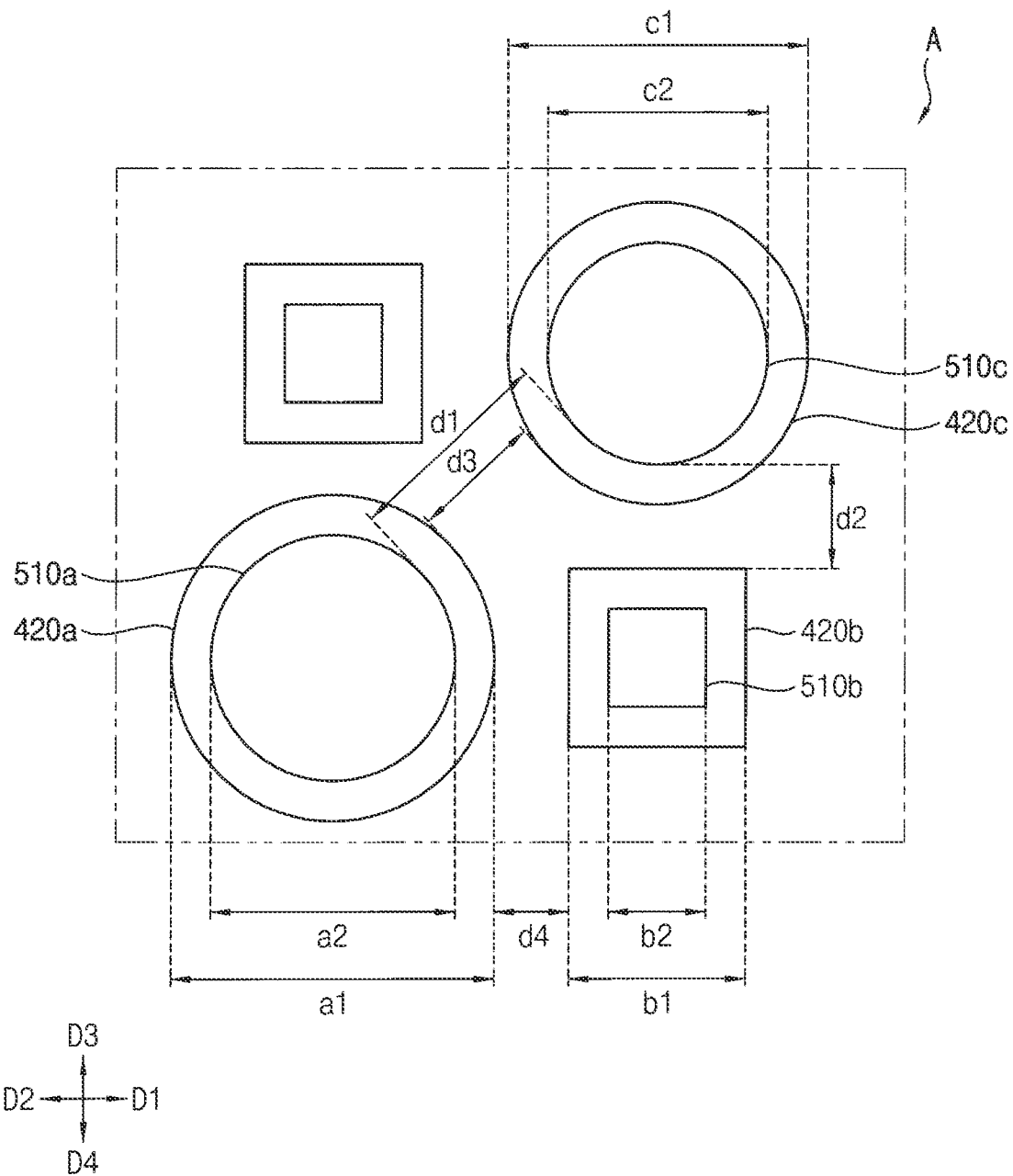
FIG. 7 is a plan view showing 'A' region of FIG. 5 according to embodiments.
Figure 8:
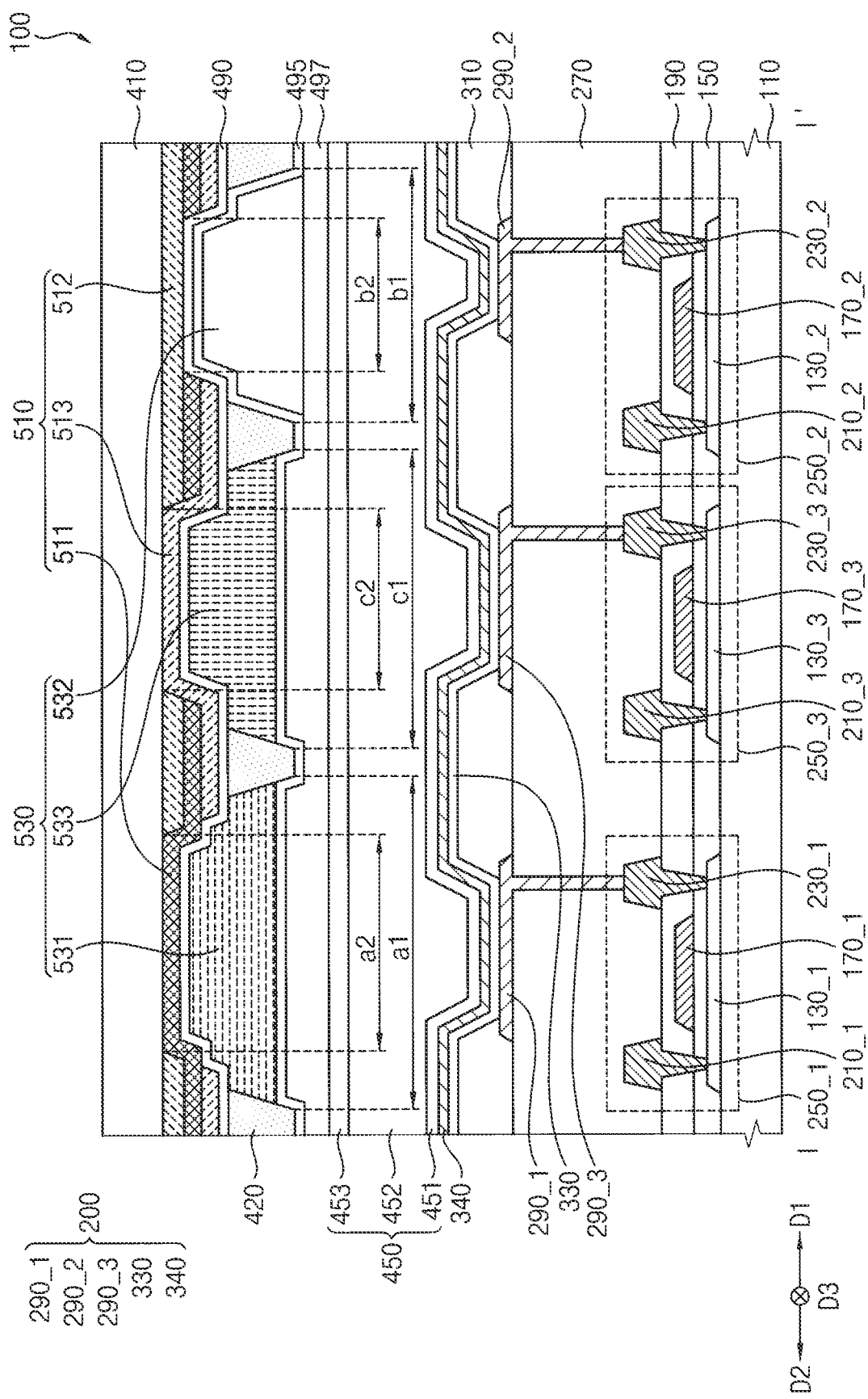
FIG. 8 is a cross-sectional view taken along line I-I' of FIG. 2 according to embodiments.

FIG. 7 is a plan view showing 'A' region of FIG. 5, and FIG. 8 is a cross-sectional view taken along line I-I' of FIG. 2.

Referring to FIGS. 7, 8, 12, and 19, the display device 100 may include a lower structure 500 and an upper structure 600.

The lower structure 500 may include a first substrate 110, a first semiconductor element 250_1, a second semiconductor element 250_2, a third semiconductor element 250_3, a gate insulating layer 150, an interlayer insulating layer 190, a planarization layer 270, a pixel structure 200, a pixel defining layer 310, a thin film encapsulation structure 450, and the like. The pixel structure 200 may include a first lower electrode 290_1, a second lower electrode 290_2, a third lower electrode 290_3, a light emitting layer 330, and an upper electrode 340. The first lower electrode 290_1, the light emitting layer 330, and the upper electrode 340 are defined as a first sub-pixel structure; the second lower electrode 290_2, the light emitting layer 330, and the upper electrode 340 are defined as a second sub-pixel structure; and the third lower electrode 290_3, the light emitting layer 330, and the upper electrode 340 are defined as a third sub-pixel structure. The first semiconductor element 250_1 may include a first active layer 130_1, a first gate electrode 170_1, a first source electrode 210_1, and a first drain electrode 230_1; the second semiconductor element 250_2 may include a second active layer 130_2, a second gate electrode 170_2, a second source electrode 210_2, and a second drain electrode 230_2; and the third semiconductor element 250_3 may include a third active layer 130_3, a third gate electrode 170_3, a third source electrode 210_3, and a third drain electrode 230_3. The thin film encapsulation structure 450 may include a first inorganic thin film encapsulation layer 451, an organic thin film encapsulation layer 452, and a second inorganic thin film encapsulation layer 453. As shown in FIG. 3, the pixel defining layer 310 may include a first circular opening 310a, a rectangular opening 310b, and a second circular opening 310c.

The upper structure 600 may include a first protective insulating layer 495, a second protective insulating layer 490, optical filters 530, an intermediate layer 497, color filters 510, a light blocking member 420, a second substrate 410, and the like. The optical filters 530 may include a first optical filter 531 (e.g., a first quantum dot pattern), a second optical filter 532 (e.g., a scattering pattern), and a third optical filter 533 (e.g., a second quantum dot pattern). The color filters 510 may include a first color filter 511, a second color filter 512, and a third color filter 513.

Referring to FIG. 2, the first sub-pixel structure may be disposed in the first sub-pixel region 31, the second sub-pixel structure may be disposed in the second sub-pixel region 32, and the third sub-pixel structure may be disposed in the third sub-pixel region 33. The display device 100 may display an image using the first to third sub-pixel structures.

Referring again to FIG. 8, a first substrate 110 may include a transparent or opaque material. The first substrate 110 may include at least one of a quartz substrate, a synthetic quartz substrate, a calcium fluoride substrate, a fluorine-doped quartz (F-doped quartz) substrate, a soda lime glass substrate, a non-alkali glass substrate, and the like.

The first substrate 110 may be a transparent resin substrate having flexibility. The transparent resin substrate may include a polyimide substrate. The polyimide substrate may have a stacked structure including a first polyimide layer, a barrier film layer, a second polyimide layer, and the like.

A buffer layer may be disposed on the first substrate 110. The buffer layer may be disposed over the whole first substrate 110. The buffer layer may prevent metal atoms or impurities from diffusing from the first substrate 110 to the semiconductor elements and the sub-pixel structures, and may control a heat transfer rate during a crystallization process for forming the active layer to obtain a substantially uniform active layer. If a surface of the first substrate 110 is not uniform, the buffer layer may provide a flatness surface over the first substrate 110. Depending on a type of the first substrate 110, at least two buffer layers may be provided on the first substrate 110, or no buffer layer may be provided. The buffer layer may include an organic insulating material and/or an inorganic insulating material.

The first to third active layers 130_1, 130_2, and 130_3 may be disposed on the first substrate 110 and may be spaced apart from each other. Each of the first to third active layers 130_1, 130_2, and 130_3 may include a metal oxide semiconductor, an inorganic semiconductor (e.g., amorphous silicon or poly silicon), an organic semiconductor, or the like, and may include a source region and a drain region.

The gate insulating layer 150 may be disposed on the first to third active layers 130_1, 130_2, and 130_3. The gate insulating layer 150 may cover the first to third active layers 130_1, 130_2, and 130_3 on the first substrate 110, and may be disposed over the whole first substrate 110. The gate insulating layer 150 may sufficiently cover the first to third active layers 130_1, 130_2, and 130_3 on the first substrate 110, and may have a substantially flat top surface without creating a step around the first to third active layers 130_1, 130_2, and 130_3. The gate insulating layer 150 may be disposed along a profile of the first to third active layers 130_1, 130_2, and 130_3 with a uniform thickness to cover the first to third active layers 130_1, 130_2, and 130_3 on the first substrate 110. The gate insulating layer 150 may include a silicon compound, metal oxide, or the like. The gate insulating layer 150 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), and the like. The gate insulating layer 150 may have a multilayer structure including a plurality of insulating layers. The insulating layers may have different thicknesses, and/or may include different materials.

The first to third gate electrodes 170_1, 170_2, and 170_3 may be disposed on the gate insulating layer 150 and may be spaced apart from each other. The first gate electrode 170_1 may be disposed on the gate insulating layer 150 and may overlap the first active layer 130_1 is located; the second gate electrode 170_2 may be disposed on the gate insulating layer 150 and may overlap the second active layer 130_2; and the third gate electrode 170_3 may be disposed on the gate insulating layer 150 and may overlap the third active layer 130_3. Each of the first to third gate electrodes 170_1, 170_2, and 170_3 may include a metal, an alloy, metal nitride, conductive metal oxide, a transparent conductive material, and the like. These may be used alone or in combination with each other. In other embodiments, each of the first to third gate electrodes 170_1, 170_2, and 170_3 may have a multilayer structure including a plurality of metal layers. The metal layers may have different thicknesses, or may include different materials.

The interlayer insulating layer 190 may be disposed on the first to third gate electrodes 170_1, 170_2, and 170_3. The interlayer insulating layer 190 may cover the first to third gate electrodes 170_1, 170_2, and 170_3, and may be disposed over a whole face of the gate insulating layer 150. The interlayer insulating layer 190 may sufficiently cover the first to third gate electrodes 170_1, 170_2, and 170_3, and may have a substantially flat top surface without creating a step around the first to third gate electrodes 170_1, 170_2, and 170_3. The interlayer insulating layer 190 may be disposed along a profile of the first to third gate electrodes 170_1, 170_2, and 170_3 with a uniform thickness to cover the first to third gate electrodes 170_1, 170_2, and 170_3 on the gate insulating layer 150. The interlayer insulating layer 190 may include a silicon compound, metal oxide, or the like. The interlayer insulating layer 190 may have a multilayer structure including a plurality of insulating layers. The insulating layers may have different thicknesses, or may include different materials.

The first source electrode 210_1, the first drain electrode 230_1, the second source electrode 210_2, the second drain electrode 230_2, the third source electrode 210_3, and the third drain electrode 230_3 may be disposed on the interlayer insulating layer 190 and may be spaced apart from each other. The first source electrode 210_1 may be connected to the source region of the first active layer 130_1 through a contact hole formed by removing first portions of the gate insulating layer 150 and the interlayer insulating layer 190, and the first drain electrode 230_1 may be connected to the drain region of the first active layer 130_1 through a contact hole formed by removing second portions of the gate insulating layer 150 and the interlayer insulating layer 190. The second source electrode 210_2 may be connected to the source region of the second active layer 130_2 through a contact hole formed by removing third portions of the gate insulating layer 150 and the interlayer insulating layer 190, and the second drain electrode 230_2 may be connected to the drain region of the second active layer 130_2 through a contact hole formed by removing fourth portions of the gate insulating layer 150 and the interlayer insulating layer 190. The third source electrode 210_3 may be connected to the source region of the third active layer 130_3 through a contact hole formed by removing fifth portions of the gate insulating layer 150 and the interlayer insulating layer 190, and the third drain electrode 230_3 may be connected to the drain region of the third active layer 130_3 through a contact hole formed by removing sixth portions of the gate insulating layer 150 and the interlayer insulating layer 190. Each of the first to third source electrodes 210_1, 210_2, and 210_3 and the first to third drain electrodes 230_1, 230_2, and 230_3 may include a metal, an alloy, metal nitride, conductive metal oxide, a transparent conductive material, and the like. These may be used alone or in combination with each other. Each of the first to third source electrodes 210_1, 210_2, and 210_3 and the first to third drain electrodes 230_1, 230_2, and 230_3 may have a multilayer structure including a plurality of metal layers. The metal layers may have different thicknesses, or may include different materials.

The first semiconductor element 250_1 may include the first active layer 130_1, the first gate electrode 170_1, the first source electrode 210_1, and the first drain electrode 230_1. The second semiconductor element 250_2 may include the second active layer 130_2, the second gate electrode 170_2, the second source electrode 210_2, and the second drain electrode 230_2. The third semiconductor element 250_3 may include the third active layer 130_3, the third gate electrode 170_3, the third source electrode 210_3, and the third drain electrode 230_3.

The display device 100 may have a configuration including a plurality of transistors and a plurality of capacitors in each pixel.

Each of the first to third semiconductor elements 250_1, 250_2, and 250_3 may have a bottom gate structure and/or a double gate structure.

The gate insulating layer 150 and the interlayer insulating layer 190 may be included in each of the first to third semiconductor elements 250_1, 250_2, and 250_3.

The planarization layer 270 may be disposed on the interlayer insulating layer 190 and the first to third semiconductor elements 250_1, 250_2, and 250_3. The planarization layer 270 may be sufficient thick to sufficiently cover the first to third source electrodes 210_1, 210_2, and 210_3 and the first to third drain electrodes 230_1, 230_2, and 230_3 on the interlayer insulating layer 190. The planarization layer 270 may have a substantially flat top surface. In order to implement the flat top surface of the planarization layer 270, a planarization process may be performed on the planarization layer 270. The planarization layer 270 may include an organic insulating material, an inorganic insulating material, or the like. The planarization layer 270 may include an organic insulating material.

The first to third lower electrodes 290_1, 290_2, and 290_3 may be disposed on the planarization layer 270 and may be spaced apart from each other. As shown in FIGS. 3 and 4, the first pixel electrode 290a may be disposed on the planarization layer 270 and may overlap the first circular opening 310a of the pixel defining layer 310; the second pixel electrode 290b may be disposed on the planarization layer 270 and may overlap the rectangular opening 310b; and the third pixel electrode 290c may be disposed on the planarization layer 270 and may overlap the second circular opening 310c. In a plan view of the display device 100, the first pixel electrode 290a may have a circular shape, the second pixel electrode 290b may have a rectangular shape, and the third pixel electrode 290c may have a circular shape. In a plan view of the display device 100, an area of each of the first pixel electrode 290a and the third pixel electrode 290c may be larger than an area of the second pixel electrode 290b. The area of the first pixel electrode 290a may be larger than the area of the third pixel electrode 290c.

The first to third lower electrodes 290_1, 290_2, and 290_3 may protrude into the planarization layer 270 to be connected to the first to third drain electrodes 230_1, 230_2, and 230_3, respectively. The first to third lower electrodes 290_1, 290_2, and 290_3 may be electrically connected to the first to third semiconductor elements 250_1, 250_2, and 250_3, respectively. Each of the first to third lower electrodes 290_1, 290_2, and 290_3 may include a metal, an alloy, metal nitride, conductive metal oxide, a transparent conductive material, and the like. For example, each of the first to third lower electrodes 290_1, 290_2, and 290_3 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Jr), an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), and the like. These may be used alone or in combination. Each of the first to third lower electrodes 290_1, 290_2, and 290_3 may have a multilayer structure including a plurality of metal layers. The metal layers may have different thicknesses, or may include different materials.

The pixel defining layer 310 may partially cover each of the first to third lower electrodes 290_1, 290_2, and 290_3 and the planarization layer 270. The pixel defining layer 310 may cover an outer periphery of each of the first to third lower electrodes 290_1, 290_2, and 290_3, and may expose a part of a top surface of each of the first to third lower electrodes 290_1, 290_2, and 290_3. The pixel defining layer 310 may include the first circular opening 310a, the rectangular opening 310b, and the second circular opening 310c, which expose the parts of the top surfaces of the first to third lower electrodes 290_1, 290_2, and 290_3, respectively. In a plan view of the display device 100, as shown in FIG. 3, the first circular opening 310a may have a circular shape, the rectangular opening 310b may have a rectangular shape, and the second circular opening 310c may have a circular shape. In a plan view of the display device 100, each of an area of the first circular opening 310a and an area of the second circular opening 310c may be larger than an area of the rectangular opening 310b. The area of the first circular opening 310a may be larger than the area of the second circular opening 310c.

One of the first circular opening 310a and the second circular opening 310c may have a circular shape, and a remaining one may have a polygonal shape that is substantially close to a circle in a plan view of the display device 100. One of the first circular opening 310a and the second circular opening 310c may have a circular shape, and the remaining one may have a rectangular shape in a plan view of the display device 100.

The pixel defining layer 310 may be formed of an organic insulating material or an inorganic insulating material. The pixel defining layer 310 may include an organic insulating material. The pixel defining layer 310 may include a photoresist, a polyacryl-based resin, a polyimide-based resin, a polyamide-based resin, a siloxane-based resin, an acryl-based resin, an epoxy-based resin, and the like.

The light emitting layer 330 may be disposed on the pixel defining layer 310 and the top surface part of each of the first to third lower electrodes 290_1, 290_2, and 290_3 exposed by the pixel defining layer 310. The light emitting layer 330 may be continuously disposed on the first substrate 110, and may be integrally formed. The light emitting layer 330 may be formed of a light emitting material for emitting blue light. Since the light emitting layer 330 emits blue light, a light loss rate of the blue light passing through the second optical filter 532 to be emitted to the outside through the second color filter 512 may be substantially small. Therefore, the size of the rectangular opening 310b may be minimized.

The light emitting layer 330 may be formed by stacking a plurality of light emitting material layers for generating different color lights (such as red light, green light, and blue light) to emit white light as a whole.

The upper electrode 340 may be disposed on the pixel defining layer 310 and the light emitting layer 330. The upper electrode 340 may include a metal, an alloy, metal nitride, conductive metal oxide, a transparent conductive material, and the like. These may be used alone or in combination. The upper electrode 340 may have a multilayer structure including a plurality of metal layers. The metal layers may have different thicknesses, or may include different materials.

The first sub-pixel structure may include the first lower electrode 290_1, the light emitting layer 330, and the upper electrode 340; the second sub-pixel structure may include the second lower electrode 290_2, the light emitting layer 330, and the upper electrode 340; the third sub-pixel structure may include the third lower electrode 290_3, the light emitting layer 330, and the upper electrode 340. The pixel structure 200 may include the first lower electrode 290_1, the second lower electrode 290_2, the third lower electrode 290_3, the light emitting layer 330, and the upper electrode 340.

The first inorganic thin film encapsulation layer 451 may be disposed on the upper electrode 340. The first inorganic thin film encapsulation layer 451 may be disposed along a profile of the upper electrode 340 with a uniform thickness to cover the upper electrode 340. The first inorganic thin film encapsulation layer 451 may prevent the pixel structure 200 from deterioration potentially caused by infiltration of moisture, oxygen, and the like. The first inorganic thin film encapsulation layer 451 may also protect the pixel structure 200 from an external impact. The first inorganic thin film encapsulation layer 451 may include an inorganic insulating material having flexibility.

The organic thin film encapsulation layer 452 may be disposed on the first inorganic thin film encapsulation layer 451. The organic thin film encapsulation layer 452 may improve flatness of the display device 100, and may protect the pixel structure 200. The organic thin film encapsulation layer 452 may include an organic insulating material having flexibility.

The second inorganic thin film encapsulation layer 453 may be disposed on the organic thin film encapsulation layer 452. The second inorganic thin film encapsulation layer 453 may be disposed along a profile of the organic thin film encapsulation layer 452 with a uniform thickness to cover the organic thin film encapsulation layer 452. The second inorganic thin film encapsulation layer 453 may prevent the pixel structure 200 from deterioration potentially caused by infiltration of moisture, oxygen, and the like. Together with the first inorganic thin film encapsulation layer 451 and the organic thin film encapsulation layer 452, the second inorganic thin film encapsulation layer 453 may also protect the pixel structure 200 from an external impact. The second inorganic thin film encapsulation layer 453 may include the inorganic insulating material having flexibility.

The thin film encapsulation structure 450 including the first inorganic thin film encapsulation layer 451, the organic thin film encapsulation layer 452 and the second inorganic thin film encapsulation layer 453 may be disposed between the intermediate layer 497 and the upper electrode 340. The thin film encapsulation structure 450 may have a five-layer structure in which first to fifth thin film encapsulation layers are stacked, or a seven-layer structure in which first to seventh thin film encapsulation layers are stacked.

The lower structure 500 may include the first substrate 110, the first semiconductor element 250_1, the second semiconductor element 250_2, the third semiconductor element 250_3, the gate insulating layer 150, the interlayer insulating layer 190, the planarization layer 270, the pixel structure 200, the pixel defining layer 310, and the thin film encapsulation structure 450.

The second substrate 410 may be disposed on the thin film encapsulation structure 450. The second substrate 410 may face (i.e., may be opposite) the first substrate 110. The second substrate 410 and the first substrate 110 may include substantially the same material. The second substrate 410 may include a quartz substrate, a synthetic quartz substrate, a calcium fluoride substrate, a fluorine-doped quartz substrate, a soda lime glass substrate, a non-alkali glass substrate, and the like.

The second color filter 512 may be disposed on a bottom surface of the second substrate 410. The second color filter 512 may be disposed between the second substrate 410 and the second optical filter 532 and may overlap the second optical filter 532. As in FIG. 13, the second color filter 512 may have openings 512a and 512b. The second color filter 512 may be disposed in the second sub-pixel region 32, may in the first to fourth directions D1, D2, D3, and D4, and may include the openings 512a and 512b that expose the first optical filter 531 and the third optical filter 533, respectively. A portion of the second color filter 512 that overlaps the second pixel electrode 290b may transmit blue light and may have a first color (e.g., a blue color).

The first color filter 511 may be disposed under the second substrate 410 and the second color filter 512. The first color filter 511 may be disposed between the second substrate 410 and the first optical filter 531 and may overlap the first optical filter 531. As shown in FIG. 14, the first color filter 511 may have openings 511a and 511b. The first color filter 511 may be disposed in the opening 512a of the second color filter 512 (or may overlap the first optical filter 531) and may extend in the first to fourth directions D1, D2, D3, and D4. The opening 511a may expose the opening 512b of the second color filter 512 may partially expose/accommodate the third optical filter 533. The opening 511b may expose a part of a bottom surface of the second color filter 512 and may partially expose/accommodate the second optical filter 532. A portion of the first color filter 511 that overlaps the first pixel electrode 290a may transmit red light and may have a second color (e.g., a red color).

The third color filter 513 may be disposed under the second substrate 410 and the first color filter 511. The third color filter 513 may be disposed between the second substrate 410 and the third optical filter 533 and may overlap the third optical filter 533. The third color filter 513 may be disposed in the opening 511a of the first color filter 511 (or may overlap the third optical filter 533), may extend in the first to fourth directions D1, D2, D3, and D4, may include a first opening that exposes the opening 511b of the first color filter 511 and partially exposes/accommodates the second optical filter 532), and may include a second opening that exposes a part of a bottom surface of the first color filter 511 and partially exposes/accommodates the first optical filter 531. A portion of the third color filter 513 that overlaps the third pixel electrode 290c may transmit green light and may have a third color (e.g., a green color).

Figure 15:
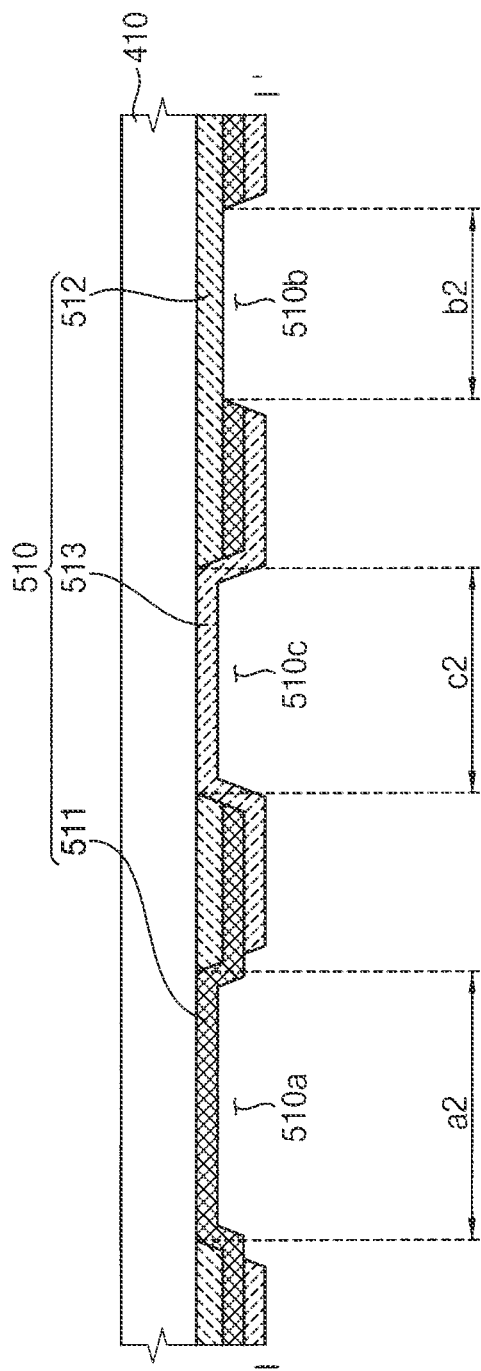

The color filters 510 may include the first color filter 511, the second color filter 512, and the third color filter 513. Referring to FIG. 13, FIG. 14, and FIG. 15, the opening 512a of the second color filter 512 and the first opening of the third color filter 513 are defined as first openings 510a of the color filters 510; the opening 511b of the first color filter 511 and the second opening of the third color filter 513 are defined as second openings 510b of the color filters 510; and the opening 512b of the second color filter 512 and the opening 511a of the first color filter 511 are defined as third openings 510c of the color filters 510. The color filters 510 may include a photosensitive resin or a color photoresist.

The first opening 510a, the second opening 510b, and the third opening 510c may be defined by a part of the first color filter 511, a part of the second color filter 512, and a part of the third color filter 513 disposed on side portions of the first opening 510a, the second opening 510b, and the third opening 510c. Since the part of the first color filter 511, the part of the second color filter 512, and the part of the third color filter 513 may overlap to block light, it is unnecessary to add a light blocking pattern that defines the first opening 510a, the second opening 510b, and the third opening 510c.

The color filters 510 may include a yellow color filter, a cyan color filter, and a magenta color filter.

The arrangement and/or order of the color filters may be configured according to embodiments.

As shown in FIGS. 7 and 15, the first opening 510a may have a fourth width a2, the second opening 510b may have a fifth width b2, and the third opening 510c may have a sixth width c2. The fourth width a2 may be greater than the fifth width b2, and the sixth width c2 may be greater than the fifth width b2. The fourth width a2 may be greater than the sixth width c2. The fourth width a2 may be approximately 77 micrometers, the fifth width b2 may be approximately 38 micrometers, and the sixth width c2 may be approximately 73 micrometers. A separation distance d1 from the first opening 510a to the third opening 510c may be approximately 56 micrometers, a separation distance from the first opening 510a to the second opening 510b may be approximately 40 micrometers, and a separation distance from the third opening 510c to the second opening 510b may be approximately 40 micrometers.

The second protective insulating layer 490 may be disposed under the color filters 510. The second protective insulating layer 490 may cover the color filters 510 on the bottom surface of the second substrate 410. The second protective insulating layer 490 may be disposed along a profile of the color filters 510 with a uniform thickness to cover the color filters 510 on the bottom surface of the second substrate 410. The second protective insulating layer 490 may sufficiently cover the color filters 510 on the bottom surface of the second substrate 410, and may have a substantially flat top surface without creating a step around the color filters 510. The second protective insulating layer 490 may include an inorganic insulating material or an organic insulating material. The second protective insulating layer 490 may include an inorganic insulating material such as silicon nitride. The second protective insulating layer 490 may have a multilayer structure including a plurality of insulating layers. The insulating layers may have different thicknesses, and/or may include different materials.

A refractive index conversion layer may be disposed between the second protective insulating layer 490 and the optical filters 530. Light that has passed through the optical filters 530 may pass through the refractive index conversion layer before t passing through the color filters 510, and a refractive index of the light may be changed. The refractive index conversion layer may include hollow silica having a predetermined refractive index.

Figure 16:
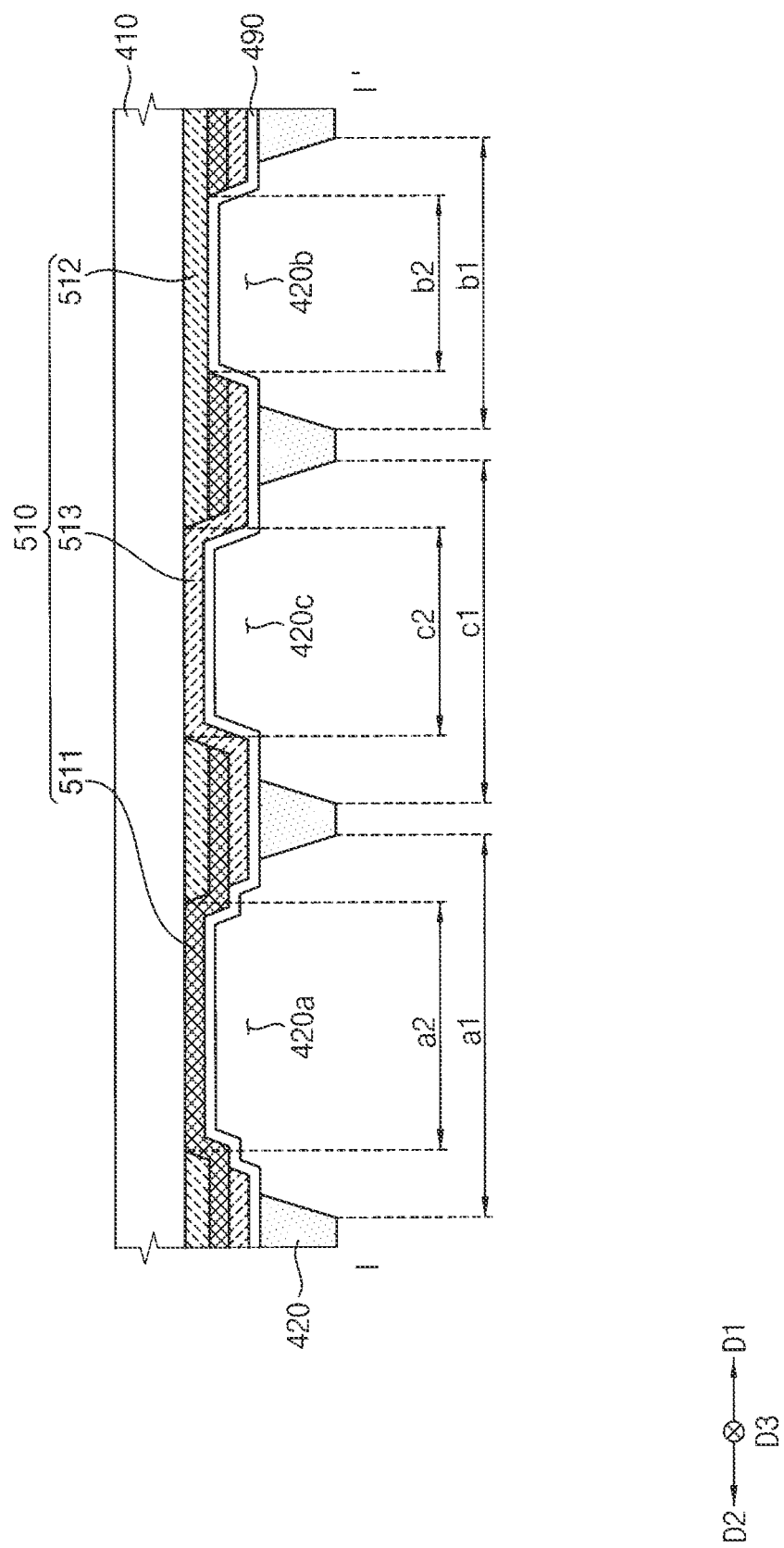

The light blocking member 420 may be disposed on a bottom surface of the second protective insulating layer 490. The light blocking member 420 may be disposed on the pixel structure 200. As shown in FIG. 16, the light blocking member 420 may include a first opening 420a, a second opening 420b, and a third opening 420c. The light blocking member 420 may include an opening part including the first opening 420a, the second opening 420b, and the third opening 420c, and a light blocking part. The light blocking part may overlap the part of the first color filter 511, the part of the second color filter 512, and the part of the third color filter 513 that define the first opening 510a, the second opening 510b, and the third opening 510c. In a plan view of the display device 100, as shown in FIGS. 5 and 6, the first opening 420a may have a circular shape, the second opening 420b may have a rectangular shape, and the third opening 420c may have a circular shape. An area of each of the first opening 420a and the third opening 420c may be larger than an area of the second opening 420b. The area of the first opening 420a may be larger than the area of the third opening 420c. The light blocking member 420 may have a plate shape including the first opening 420a, the second opening 420b, and the third opening 420c. The first opening 510a, the second opening 510b, and the third opening 510c of the color filters 510 may overlap the first opening 420a, the second opening 420b, and the third opening 420c of the light blocking member 420, respectively.

As shown in FIGS. 7 and 16, the first opening 420a may have a first width a1, the second opening 420b may have a second width b1, and the third opening 420c may have a third width c1. The first width a1 may be greater than the second width b1, and the third width c1 may be greater than the second width b1. The first width a1 may be greater than the third width c1. The first width a1 may be approximately 113 micrometers, the second width b1 may be greater than approximately 38 micrometers, and the third width c1 may be approximately 109 micrometers. A separation distance d3 from the first opening 420a to the third opening 420c may be approximately 20 micrometers, a separation distance d4 from the first opening 420a to the second opening 420b may be approximately 22 micrometers, and a separation distance from the third opening 420c to the second opening 420b may be approximately 22 micrometers.

The light blocking member 420 may block or absorb light incident from the outside. The light blocking member 420 may prevent a color mixture phenomenon that may occur in the optical filters 530. For example, if the display device 100 does not include the light blocking member 420, a part of light incident on the third optical filter 533 may be incident on the first optical filter 531, and the rest of the light may be incident on the second optical filter 532. The color mixture phenomenon may occur.

The light blocking member 420 may include an organic material such as a photoresist, a polyacryl-based resin, a polyimide-based resin, a polyamide-based resin, a siloxane-based resin, an acryl-based resin, and an epoxy-based resin. The light blocking member 420 may be substantially opaque. The light blocking member 420 may further include a light blocking material to absorb the light. The light blocking material may include carbon black, titanium nitride oxide, titanium black, phenylene black, aniline black, cyanine black, nigrosine acid black, a black resin, and the like.

The first optical filter 531 may be disposed on the bottom surface of the second protective insulating layer 490 and in the first opening 420a of the light blocking member 420. The first optical filter 531 may be disposed on the pixel structure 200 and may overlap the first pixel electrode 290a. Referring to FIG. 6, since the first optical filter 531 is disposed in the first opening 420a having a circular shape in a plan view, the first optical filter 531 may also have a circular shape in a plan view. The area of the first optical filter 531 may be larger than the area of the second optical filter 532. The first optical filter 531 may overlap the first color filter 511. The first optical filter 531 may be spaced apart from each of the second optical filter 532 and the third optical filter 533 by the light blocking part of the light blocking member 420. The first optical filter 531 may convert blue light into red light. The first optical filter 531 may include a plurality of quantum dots configured to absorb blue light and emit red light.

The third optical filter 533 may be disposed on the bottom surface of the second protective insulating layer 490 and in the third opening 420c of the light blocking member 420. The third optical filter 533 may be disposed on the pixel structure 200 and may overlap the third pixel electrode 290c. Referring to FIG. 6, since the third optical filter 533 is disposed in the third opening 420c having a circular shape in a plan view, the third optical filter 533 may also have a circular shape in a plan view. The area of the third optical filter 533 may be larger than the area of the second optical filter 532. The third optical filter 533 may overlap the third color filter 513. The third optical filter 533 may be spaced apart from each of the first optical filter 531 and the second optical filter 532 by the light blocking part of the light blocking member 420. The third optical filter 533 may convert blue light into green light. The third optical filter 533 may include a plurality of quantum dots configured to absorb blue light and emit green light.

The first optical filter 531 and the third optical filter 533 may be disposed on the same layer (e.g., each directly contacting a bottom surface of the second protective insulating layer 490). A level of a bottom surface of the first optical filter 531 and a level of a bottom surface of the third optical filter 533 may be the coplanar.

The quantum dots included in each of the first optical filter 531 and the third optical filter 533 may include one nanocrystal among a silicon (Si)-based nanocrystal, a group II-VI-based compound semiconductor nanocrystal, a group III-V-based compound semiconductor nanocrystal, a group IV-VI-based compound semiconductor nanocrystal, and a mixture thereof. The group II-VI-based compound semiconductor nanocrystal may be one selected from the group consisting of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, and HgZnSTe. The group III-V-based compound semiconductor nanocrystal may be one selected from the group consisting of GaN, GaP, GaAs, AN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs. The group IV-VI-based compound semiconductor nanocrystal may be SbTe.

Even when the quantum dots included in each of the first optical filter 531 and the third optical filter 533 include the same material, an emission wavelength may vary according to sizes of the quantum dots. As the size of the quantum dot decreases, light of a shorter wavelength may be emitted. Light within a desired visible light region may be emitted by adjusting the sizes of the quantum dots included in each of the first optical filter 531 and the third optical filter 533.

The quantum dots included in the first optical filter 531 and the third optical filter 533 may be formed of the same material, and the (average/maximum/minimum) size of the quantum dots included in the first optical filter 531 may be larger than the (average/maximum/minimum) size of the quantum dots included in the third optical filter 533.

The first protective insulating layer 495 may be disposed directly under the first optical filter 531, the third optical filter 533, the light blocking member 420, and a part of the second protective insulating layer 490. The first protective insulating layer 495 may cover the first optical filter 531, the third optical filter 533, and the light blocking member 420. The second protective insulating layer 490 and the first protective insulating layer 495 may be spaced apart from each other by each of the first optical filter 531 and the third optical filter 533, and the second protective insulating layer 490 and the first protective insulating layer 495 may directly contact each other through the second opening 420b. The first protective insulating layer 495 may be disposed inside the second opening 420b so that the first protective insulating layer 495 may not be disposed on a bottom surface of the second optical filter 532, and the first protective insulating layer 495 may not be disposed through the first opening 420a or through the third opening 420c so that the first protective insulating layer 495 may not be disposed on a top surface of each of the first optical filter 531 and the third optical filter 533. The first protective insulating layer 495 may be disposed along a profile of the first optical filter 531, the third optical filter 533, and the light blocking member 420 with a uniform thickness to cover the first optical filter 531, the third optical filter 533, and the light blocking member 420. The first protective insulating layer 495 may include an inorganic insulating material or an organic insulating material. The first protective insulating layer 495 may include an inorganic insulating material such as silicon nitride. The first protective insulating layer 495 may have a multilayer structure including a plurality of insulating layers. The insulating layers may have different thicknesses, and/or may include different materials.

The second optical filter 532 may be disposed on a bottom surface of the first protective insulating layer 495 and in the second opening 420b of the light blocking member 420. The second optical filter 532 may be disposed on the pixel structure 200 and may overlap the second pixel electrode 290b. Referring to FIG. 6, since the second optical filter 532 is disposed in the second opening 420b having a rectangular shape in a plan view, the second optical filter 532 may also have a rectangular shape in a plan view. The area of the second optical filter 532 may be smaller than the area of each of the first optical filter 531 and the third optical filter 533 in a plan view of the display device 100. The second optical filter 532 may overlap the second color filter 512. The second optical filter 532 may be spaced apart from each of the first optical filter 531 and the third optical filter 533 by the light blocking part of the light blocking member 420. The second optical filter 532 may transmit blue light. The second optical filter 532 may include a scattering material that emits blue light with no significant color change. The second optical filter 532 may not include the quantum dots. Each of the first optical filter 531 and the third optical filter 533 may further include the scattering material.

Since the second optical filter 532 is disposed on a bottom surface of the first protective insulating layer 495, the top surface of the second optical filter 532 may not be coplanar with either of the top surface of the first optical filter 531 and the top surface of the third optical filter 533. A level of the bottom surface of the second optical filter 532 may not be coplanar with either of the level of the bottom surface of the first optical filter 531 and the level of the bottom surface of the third optical filter 533. The bottom surface of the second optical filter 532 may be closer to a top surface of the thin film encapsulation structure 450 than each of the bottom surface of the first optical filter 531 and the bottom surface of the third optical filter 533.

The second optical filter 532 may include TiO, ZrO, $AlO_3$, $In_2O_3$, ZnO, $SnO_2$, $Sb_2O_3$, ITO, and the like. The second optical filter 532 may include a material that scatters blue light without significantly converting the color of the blue light.

The arrangement/order of the first optical filter 531, the third optical filter 533, and the second optical filter 532 may be configured according to embodiments.

The optical filters 530 may include the first optical filter 531, the second optical filter 532, and the third optical filter 533.

The intermediate layer 497 may be disposed under the first protective insulating layer 495 and the second optical filter 532. The intermediate layer 497 may be disposed on the bottom surface of the first protective insulating layer 495 and may cover the second optical filter 532. The intermediate layer 497 may be sufficiently thick to sufficiently cover the second optical filter 532. The intermediate layer 497 may be disposed on the thin film encapsulation structure 450. The intermediate layer 497 may include an organic insulating material, an inorganic insulating material, or the like.

A sealing member may be disposed in the peripheral region 20 between the first substrate 110 and the second substrate 410. The sealing member may substantially surround the display region 10. The sealing member may make contact with the bottom surface of the second substrate 410 and the top surface of the first substrate 110. At least one insulating layer (e.g., the gate insulating layer 150, the interlayer insulating layer 190, the first inorganic thin film encapsulation layer 451, the second inorganic thin film encapsulation layer 453, etc.) may be interposed between a bottom surface of the sealing member and the top surface of the first substrate 110.

The sealing member may include a non-conductive material. The sealing member may include a frit or the like. The sealing member may additionally include a photocurable material. The sealing member may include a mixture of an organic material and a photocurable material, and the mixture may be irradiated with ultraviolet (UV) rays, laser light, visible light, or the like so as to be cured so that the sealing member may be obtained. The photocurable material included in the sealing member may include an epoxy acrylate-based resin, a polyester acrylate-based resin, a urethane acrylate-based resin, a polybutadiene acrylate-based resin, a silicon acrylate-based resin, an alkyl acrylate-based resin, and the like.

Laser light may be irradiated onto the mixture of the organic material and the photocurable material. As the laser light is irradiated, the mixture may be changed from a solid state to a liquid state, and the mixture in the liquid state may be cured into the solid state after a predetermined time. The second substrate 410 may be coupled to the first substrate 110 and may be sealed with respect to the first substrate 110 according to the state change of the mixture.

The upper structure 600 may include the second protective insulating layer 490, the first protective insulating layer 495, the optical filters 530, the intermediate layer 497, the color filters 510, the light blocking member 420, and the second substrate 410. The display device 100 may include the lower structure 500 and the upper structure 600 shown in FIG. 8.

The display device 100 may be/include a liquid crystal display device (LCD), a field emission display device (FED), a plasma display device (PDP), and an electrophoretic display device (EPD). The second substrate 410 on which the optical filters 530, the color filters 510, and the like are disposed may be a second substrate of a liquid crystal display device, a field emission display device, a plasma display device, and/or an electrophoretic display device.

In a display device, an optical filter (e.g., a quantum dot layer) may be formed in an opening of a light blocking member using an inkjet process. Since a minimum volume margin for setting an ink is required, the opening of the light blocking member may have a polygonal shape. The optical filter may also have a polygonal shape. The light blocking member may cause an undesirably large light loss in consideration of a preset area in which the optical filter is formed. Because a length of a perimeter of a polygon is relatively long based on the same area, a relatively large amount of light emitted from a light emitting layer may be blocked by the light blocking member surrounding the opening having a polygonal shape. If the resolution of the display device is high, a size of a sub-pixel region may be substantially small, and a size of each of the optical filter and the light blocking member may be substantially small. In this case, line widths of light blocking parts of the light blocking member (e.g., a width of the light blocking member located between adjacent openings) may be substantially small, such that the light blocking member may have a small contact area and may be peeled off.

The display device 100 includes the first and third optical filters 531 and 533 having a circular shape in a plan view. Because a length of a perimeter of a circle is shorter than the length of the perimeter of a polygon (e.g., an asymmetric polygon) based on a preset area, the light blocking member 420 including the first and third openings 420a and 430c having a circular shape may cause a relatively small light loss. Only a relatively small amount of the light emitted from the light emitting layer 330 may be blocked from the light blocking member 420. Advantageously, the display device 100 may have high light transmission efficiency.

Since the display device 100 includes the first and third optical filters 531 and 533 having a circular shape and the second optical filter 532 having a rectangular shape, the first opening 420a, the second opening 420b, and the third opening 420c of the light blocking member 420 may be sufficiently separated from each other, so that light blocking parts of the light blocking member 420 may be sufficiently wide. Advantageously, a contact area of the light blocking member 420 may be sufficiently large, and the light blocking member 420 may not be peeled off.

FIGS. 9 to 20 are cross-sectional views showing structures formed in a method of manufacturing a display device according to embodiments.

Figure 9:
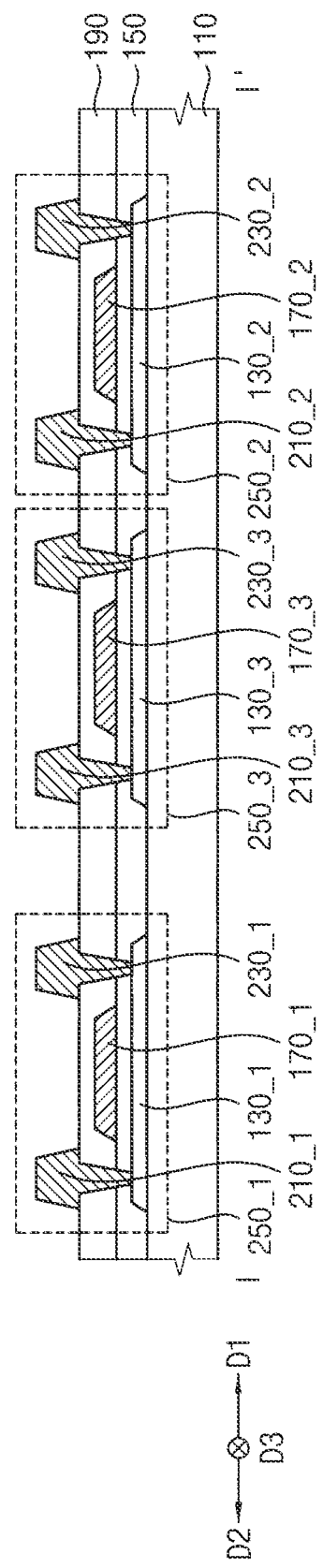

Referring to FIG. 9, the first substrate 110 including a transparent or opaque material may be provided. The first substrate 110 may be/include a quartz substrate, a synthetic quartz substrate, a calcium fluoride substrate, a fluorine-doped quartz substrate, a soda lime glass substrate, a non-alkali glass substrate, and the like.

The first substrate 110 may be a transparent resin substrate having flexibility. Examples of the transparent resin substrate that may be used as the first substrate 110 may include a polyimide substrate. The polyimide substrate may include a first polyimide layer, a barrier film layer, a second polyimide layer, and the like. The polyimide substrate may have a configuration in which the first polyimide layer, the barrier film layer, and the second polyimide layer are sequentially stacked on a rigid glass substrate. In a method of manufacturing a display device, after forming an insulating layer (e.g., a buffer layer) on the second polyimide layer of the polyimide substrate, semiconductor elements, sub-pixel structures, and the like may be formed on the insulating layer. After the semiconductor elements and the sub-pixel structure are formed, the rigid glass substrate may be removed. In other words, since the polyimide substrate is thin and flexible, it may be difficult to directly form the semiconductor elements and the sub-pixel structure on the polyimide substrate. In consideration of this point, after the semiconductor elements and the sub-pixel structure are formed by using the rigid glass substrate, the glass substrate may be removed, so that the polyimide substrate may be used as the first substrate 110.

A buffer layer may be formed on the first substrate 110. The buffer layer may be formed over the whole first substrate 110. Depending on a type of the first substrate 110, at least two buffer layers may be provided on the first substrate 110, or the buffer layer may not be formed. The buffer layer may be formed by using an organic material or an inorganic material.

The first to third active layers 130_1, 130_2, and 130_3 may be formed on the first substrate 110 and may be spaced apart from each other. Each of the first to third active layers 130_1, 130_2, and 130_3 may be formed by using an oxide semiconductor, an inorganic semiconductor, an organic semiconductor, or the like, and may include a source region and a drain region. The first to third active layers 130_1, 130_2, and 130_3 may be simultaneously formed on the same layer by using the same material.

The gate insulating layer 150 may be formed on the first to third active layers 130_1, 130_2, and 130_3. The gate insulating layer 150 may cover the first to third active layers 130_1, 130_2, and 130_3 on the first substrate 110, and may be formed over the whole first substrate 110. The gate insulating layer 150 may sufficiently cover the first to third active layers 130_1, 130_2, and 130_3 on the first substrate 110, and may have a substantially flat top surface without creating a step around the first to third active layers 130_1, 130_2, and 130_3. The gate insulating layer 150 may be formed along a profile of the first to third active layers 130_1, 130_2, and 130_3 with a uniform thickness to cover the first to third active layers 130_1, 130_2, and 130_3 on the first substrate 110. The gate insulating layer 150 may be formed of a silicon compound, metal oxide, or the like. The gate insulating layer 150 may include $SiO_x$, $SiN_x$, $SiO_xN_y$, $SiO_xC_y$, $SiC_xN_y$, $AlO_x$, $AlN_x$, $TaO_x$, $HfO_x$, $ZrO_x$, $TiO_x$, and the like.

The first to third gate electrodes 170_1, 170_2, and 170_3 may be formed on the gate insulating layer 150 and may be spaced apart from each other. The first gate electrode 170_1 may be formed on a portion of the gate insulating layer 150 under which the first active layer 130_1 is located, the second gate electrode 170_2 may be formed on a portion of the gate insulating layer 150 under which the second active layer 130_2 is located, and the third gate electrode 170_3 may be formed on a portion of the gate insulating layer 150 under which the third active layer 130_3 is located. Each of the first to third gate electrodes 170_1, 170_2, and 170_3 may be formed by using a metal, an alloy, metal nitride, conductive metal oxide, a transparent conductive material, and the like. These may be used alone or in combination with each other. The first to third gate electrodes 170_1, 170_2, and 170_3 may be simultaneously formed on the same layer using the same material.

The interlayer insulating layer 190 may be formed on the first to third gate electrodes 170_1, 170_2, and 170_3. The interlayer insulating layer 190 may cover the first to third gate electrodes 170_1, 170_2, and 170_3 on the gate insulating layer 150, and may be formed over the whole gate insulating layer 150. The interlayer insulating layer 190 may sufficiently cover the first to third gate electrodes 170_1, 170_2, and 170_3 on the gate insulating layer 150, and may have a substantially flat top surface without creating a step around the first to third gate electrodes 170_1, 170_2, and 170_3. The interlayer insulating layer 190 may be formed along a profile of the first to third gate electrodes 170_1, 170_2, and 170_3 with a uniform thickness to cover the first to third gate electrodes 170_1, 170_2, and 170_3 on the gate insulating layer 150. The interlayer insulating layer 190 may be formed of a silicon compound, metal oxide, or the like.

The first source electrode 210_1, the first drain electrode 230_1, the second source electrode 210_2, the second drain electrode 230_2, the third source electrode 210_3, and the third drain electrode 230_3 may be formed on the interlayer insulating layer 190 and may be spaced apart from each other. The first source electrode 210_1 may be connected to the source region of the first active layer 130_1 through a contact hole formed by removing first portions of the gate insulating layer 150 and the interlayer insulating layer 190, and the first drain electrode 230_1 may be connected to the drain region of the first active layer 130_1 through a contact hole formed by removing second portions of the gate insulating layer 150 and the interlayer insulating layer 190. The second source electrode 210_2 may be connected to the source region of the second active layer 130_2 through a contact hole formed by removing third portions of the gate insulating layer 150 and the interlayer insulating layer 190, and the second drain electrode 230_2 may be connected to the drain region of the second active layer 130_2 through a contact hole formed by removing fourth portions of the gate insulating layer 150 and the interlayer insulating layer 190. The third source electrode 210_3 may be connected to the source region of the third active layer 130_3 through a contact hole formed by removing fifth portions of the gate insulating layer 150 and the interlayer insulating layer 190, and the third drain electrode 230_3 may be connected to the drain region of the third active layer 130_3 through a contact hole formed by removing sixth portions of the gate insulating layer 150 and the interlayer insulating layer 190. Each of the first to third source electrodes 210_1, 210_2, and 210_3 and the first to third drain electrodes 230_1, 230_2, and 230_3 may be formed of a metal, an alloy, metal nitride, conductive metal oxide, a transparent conductive material, and the like. These may be used alone or in combination with each other. The first to third source electrodes 210_1, 210_2, and 210_3 and the first to third drain electrodes 230_1, 230_2, and 230_3 may be simultaneously formed on the same layer using the same material.

Accordingly, the first semiconductor element 250_1 including the first active layer 130_1, the first gate electrode 170_1, the first source electrode 210_1, and the first drain electrode 230_1 may be formed, the second semiconductor element 250_2 including the second active layer 130_2, the second gate electrode 170_2, the second source electrode 210_2, and the second drain electrode 230_2 may be formed, and the third semiconductor element 250_3 including the third active layer 130_3, the third gate electrode 170_3, the third source electrode 210_3, and the third drain electrode 230_3 may be formed.

Figure 10:
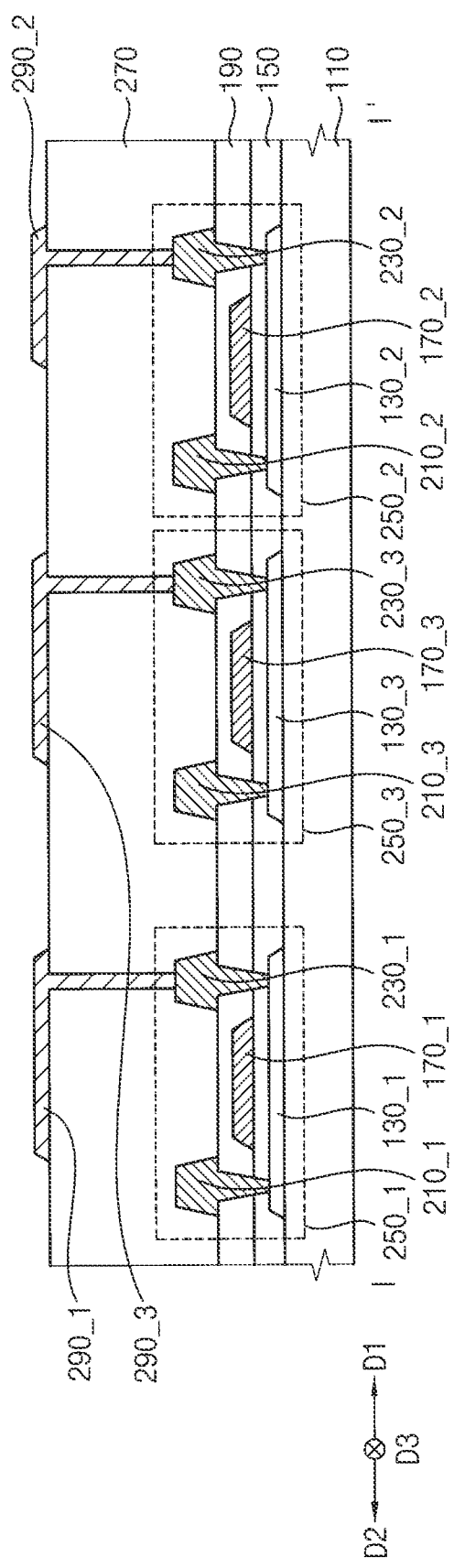

Referring to FIG. 10, the planarization layer 270 may be formed on the interlayer insulating layer 190 and the first to third semiconductor elements 250_1, 250_2, and 250_3. The planarization layer 270 may have a relatively thick thickness to sufficiently cover the first to third source electrodes 210_1, 210_2, and 210_3 and the first to third drain electrodes 230_1, 230_2, and 230_3 on the interlayer insulating layer 190. The planarization layer 270 may have a substantially flat top surface. In order to implement such a flat top surface of the planarization layer 270, a planarization process may be additionally performed on the planarization layer 270. The planarization layer 270 may be formed of an organic material.

The first to third lower electrodes 290_1, 290_2, and 290_3 may be formed on the planarization layer 270 and may be spaced apart from each other. As shown in FIG. 4, the first pixel electrode 290a may have a circular shape, the second pixel electrode 290b may have a rectangular shape, and the third pixel electrode 290c may have a circular shape. An area of each of the first pixel electrode 290a and the third pixel electrode 290c may be larger than an area of the second pixel electrode 290b. The first to third lower electrodes 290_1, 290_2, and 290_3 may pass through the planarization layer 270 so as to be connected to the first to third drain electrodes 230_1, 230_2, and 230_3, respectively. Each of the first to third lower electrodes 290_1, 290_2, and 290_3 may be formed of a metal, an alloy, metal nitride, conductive metal oxide, a transparent conductive material, and the like. For example, each of the first to third lower electrodes 290_1, 290_2, and 290_3 may include Au, Ag, Al, Pt, Ni, Ti, Pd, Mg, Ca, Li, Cr, Ta, W, Cu, Mo, Sc, Nd, Jr, an aluminum-containing alloy, $AlN_x$, a silver-containing alloy, $WN_x$, a copper-containing alloy, a molybdenum-containing alloy, $TiN_x$, $CrN_x$, $TaN_x$, $SrRu_xO_y$, $ZnO_x$, ITO, $SnO_x$, $InO_x$, $GaO_x$, IZO, and the like. These may be used alone or in combination with each other. The first to third lower electrodes 290_1, 290_2, and 290_3 may be simultaneously formed on the same layer using the same material.

Figure 11:
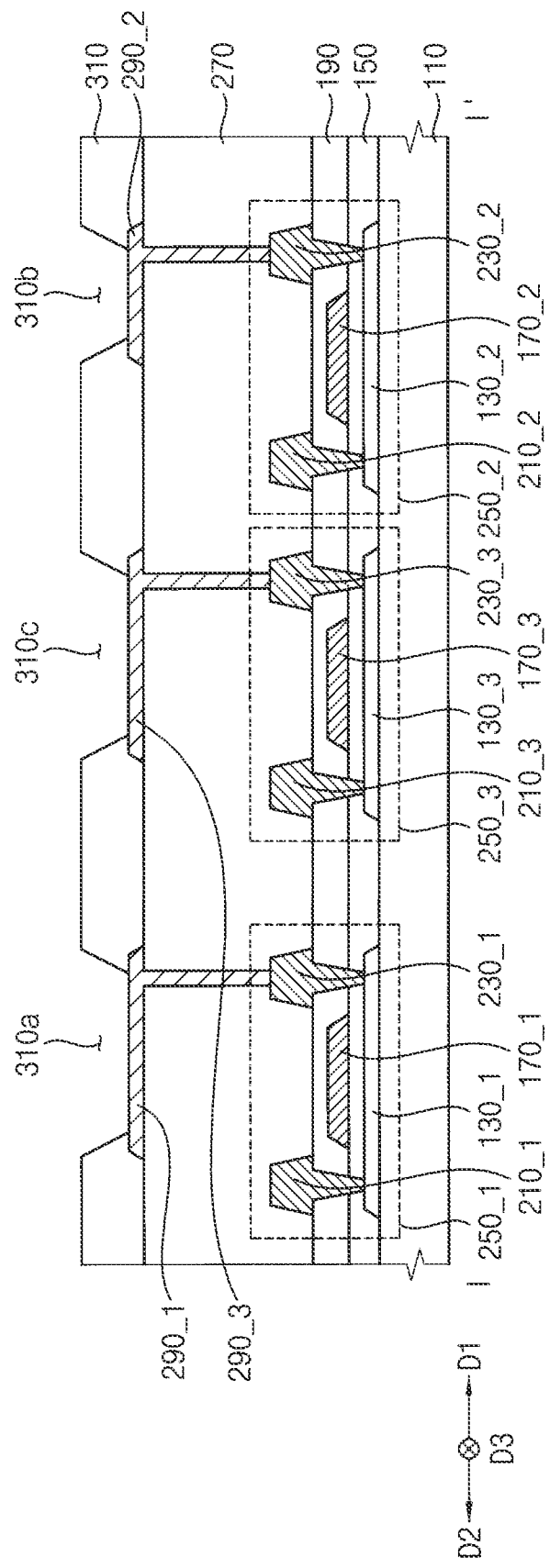

Referring to FIGS. 3, 4, and 11, the pixel defining layer 310 may be formed on a part of each of the first to third lower electrodes 290_1, 290_2, and 290_3 and the planarization layer 270. The pixel defining layer 310 may cover both side portions (e.g., an outer periphery) of each of the first to third lower electrodes 290_1, 290_2, and 290_3, and may expose a part of a top surface of each of the first to third lower electrodes 290_1, 290_2, and 290_3. The pixel defining layer 310 may be formed with the first circular opening 310a, the rectangular opening 310b, and the second circular opening 310c, which expose the parts of the top surfaces of the first to third lower electrodes 290_1, 290_2, and 290_3, respectively. The first circular opening 310a may have a circular shape, the rectangular opening 310b may have a rectangular shape, and the second circular opening 310c may have a circular shape. An area of each of the first circular opening 310a and the second circular opening 310c may be larger than an area of the rectangular opening 310b. The pixel defining layer 310 may be formed of an organic insulating material. The pixel defining layer 310 may include a photoresist, a polyacryl-based resin, a polyimide-based resin, a polyamide-based resin, a siloxane-based resin, an acryl-based resin, an epoxy-based resin, and the like.

Figure 12:
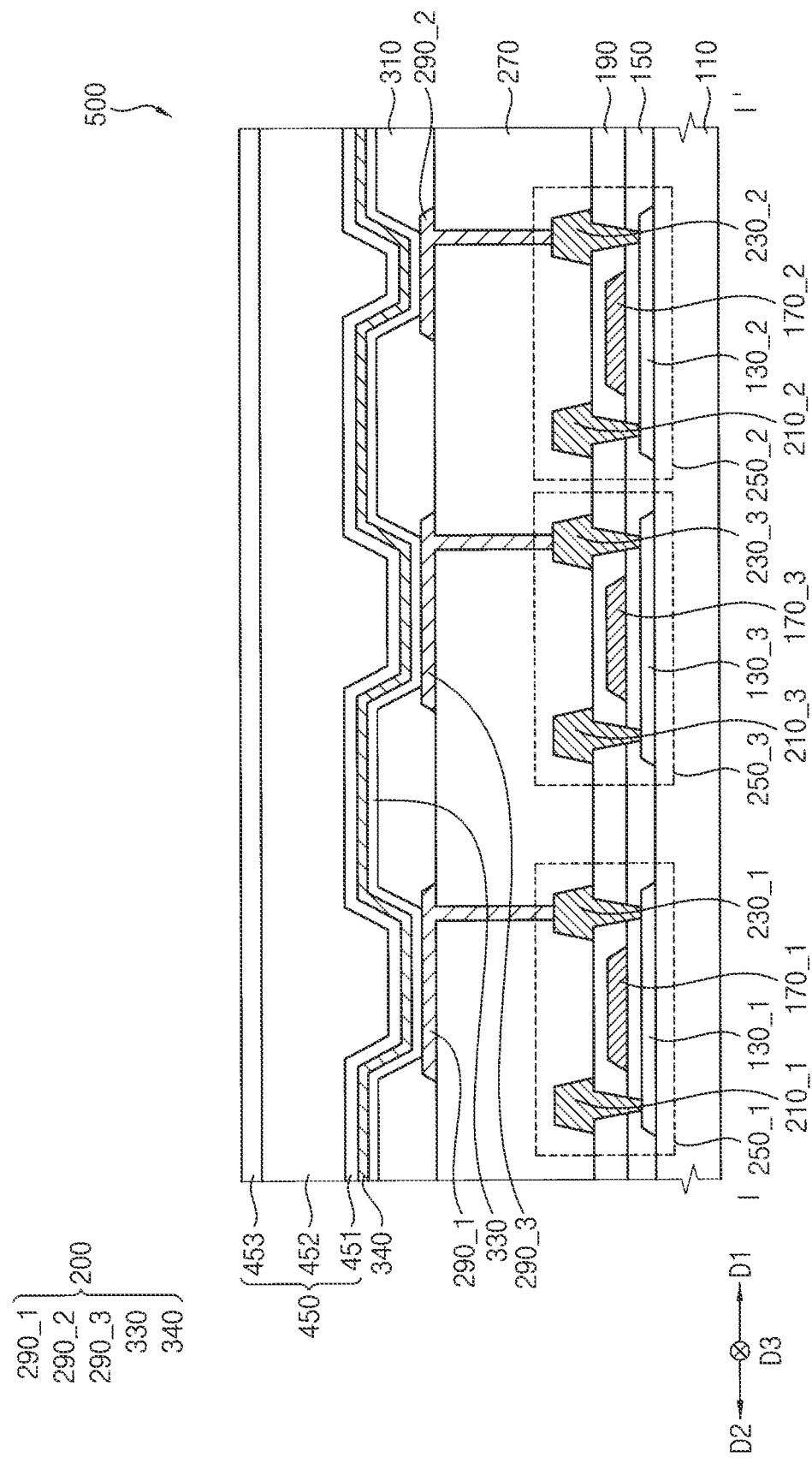

Referring to FIG. 12, the light emitting layer 330 may be formed on the first to third lower electrodes 290_1, 290_2, and 290_3 exposed by the pixel defining layer 310. The light emitting layer 330 may be continuously (or integrally) formed on the first substrate 110. The light emitting layer 330 may be formed of a light emitting material for emitting blue light. The light emitting layer 330 may be formed by stacking a plurality of light emitting materials for generating different color lights such as red light, green light, and blue light to emit white light as a whole.

The upper electrode 340 may be formed in the display region 10 on the pixel defining layer 310 and the light emitting layer 330. The upper electrode 340 may be formed of a metal, an alloy, metal nitride, conductive metal oxide, a transparent conductive material, and the like. These may be used alone or in combination with each other.

Accordingly, the first sub-pixel structure including the first lower electrode 290_1, the light emitting layer 330, and the upper electrode 340 may be formed, the second sub-pixel structure including the second lower electrode 290_2, the light emitting layer 330, and the upper electrode 340 may be formed, and the third sub-pixel structure including the third lower electrode 290_3, the light emitting layer 330, and the upper electrode 340 may be formed. The pixel structure 200 including the first lower electrode 290_1, the second lower electrode 290_2, the third lower electrode 290_3, the light emitting layer 330, and the upper electrode 340 may be formed.

The first inorganic thin film encapsulation layer 451 may be formed on the upper electrode 340. The first inorganic thin film encapsulation layer 451 may be formed along a profile of the upper electrode 340 with a uniform thickness to cover the upper electrode 340. The first inorganic thin film encapsulation layer 451 may be formed of an inorganic insulating material having flexibility.

The organic thin film encapsulation layer 452 may be formed on the first inorganic thin film encapsulation layer 451. The organic thin film encapsulation layer 452 may be formed of an organic insulating material having flexibility.

The second inorganic thin film encapsulation layer 453 may be formed on the organic thin film encapsulation layer 452. The second inorganic thin film encapsulation layer 453 may be formed along a profile of the organic thin film encapsulation layer 452 with a uniform thickness to cover the organic thin film encapsulation layer 452. The second inorganic thin film encapsulation layer 453 may be formed of the inorganic insulating material having flexibility.

Accordingly, the thin film encapsulation structure 450 including the first inorganic thin film encapsulation layer 451, the organic thin film encapsulation layer 452 and the second inorganic thin film encapsulation layer 453 may be formed, and the lower structure 500 including the first substrate 110, the first semiconductor element 250_1, the second semiconductor element 250_2, the third semiconductor element 250_3, the gate insulating layer 150, the interlayer insulating layer 190, the planarization layer 270, the pixel structure 200, the pixel defining layer 310, and the thin film encapsulation structure 450 may be provided.

Referring to FIG. 13, the second substrate 410 may be provided. The second substrate 410 and the first substrate 110 may include substantially the same material. The second substrate 410 may be/include a quartz substrate, a synthetic quartz substrate, a calcium fluoride substrate, a fluorine-doped quartz substrate, a soda lime glass substrate, a non-alkali glass substrate, and the like.

The second color filter 512 may be formed on a bottom surface of the second substrate 410. The second color filter 512 may have openings 512a and 512b. The second color filter 512 may transmit blue light and may have a blue color.

Referring to FIG. 14, the first color filter 511 may be formed under the bottom surface of the second substrate 410 and the second color filter 512. The first color filter 511 may have openings 511a and 511b. The first color filter 511 may transmit red light, and may be a color filter having a red color.

Referring to FIG. 15, the third color filter 513 may be formed under the bottom surface of the second substrate 410 and the first color filter 511. The third color filter 513 may have a first opening that exposes the opening 511b of the first color filter 511 and a second opening that exposes a part of a bottom surface of the first color filter 511 under the first color filter 511. The third color filter 513 may transmit green light, and may be a color filter having a green color.

Accordingly, the color filters 510 including the first color filter 511, the second color filter 512, and the third color filter 513 may be formed. The opening 512a of the second color filter 512 and the first opening of the third color filter 513 are defined as first openings 510a of the color filters 510, the opening 511b of the first color filter 511 and the second opening of the third color filter 513 are defined as second openings 510b of the color filters 510, and the opening 512b of the second color filter 512 and the opening 511a of the first color filter 511 are defined as third openings 510c of the color filters 510. The first opening 510a may have a fourth width a2, the second opening 510b may have a fifth width b2, and the third opening 510c may have a sixth width c2. The fourth width a2 may be greater than the fifth width b2, and the sixth width c2 may be greater than the fifth width b2. The color filters 510 may be formed of a photosensitive resin or a color photoresist.

Referring to FIGS. 5 and 16, the second protective insulating layer 490 may be formed under the color filters 510. The second protective insulating layer 490 may cover the color filters 510 on the bottom surface of the second substrate 410. The second protective insulating layer 490 may be formed along a profile of the color filters 510 with a uniform thickness to cover the color filters 510 on the bottom surface of the second substrate 410. The second protective insulating layer 490 may sufficiently cover the color filters 510 on the bottom surface of the second substrate 410, and may have a substantially flat top surface without creating a step around the color filters 510. The second protective insulating layer 490 may be formed of an inorganic insulating material such as silicon nitride.

The light blocking member 420 may be formed on a bottom surface of the second protective insulating layer 490. The light blocking member 420 may have a first opening 420a, a second opening 420b, and a third opening 420c. The first opening 420a may have a circular shape, the second opening 420b may have a rectangular shape, and the third opening 420c may have a circular shape. An area of each of the first opening 420a and the third opening 420c may be larger than an area of the second opening 420b. The light blocking member 420 may have a plate shape including the first opening 420a, the second opening 420b, and the third opening 420c. The first opening 510a, the second opening 510b, and the third opening 510c of the color filters 510 may overlap the first opening 420a, the second opening 420b, and the third opening 420c of the light blocking member 420, respectively. The first opening 420a may have a first width a1, the second opening 420b may have a second width b1, and the third opening 420c may have a third width c1. The first width a1 may be greater than the second width b1, and the third width c1 may be greater than the second width b1.

The light blocking member 420 may be formed of an organic material such as a photoresist, a polyacryl-based resin, a polyimide-based resin, a polyamide-based resin, a siloxane-based resin, an acryl-based resin, and an epoxy-based resin. The light blocking member 420 may be substantially opaque. The light blocking member 420 may further include a light blocking material to absorb the light. The light blocking material may include carbon black, titanium nitride oxide, titanium black, phenylene black, aniline black, cyanine black, nigrosine acid black, a black resin, and the like.

Figure 17:
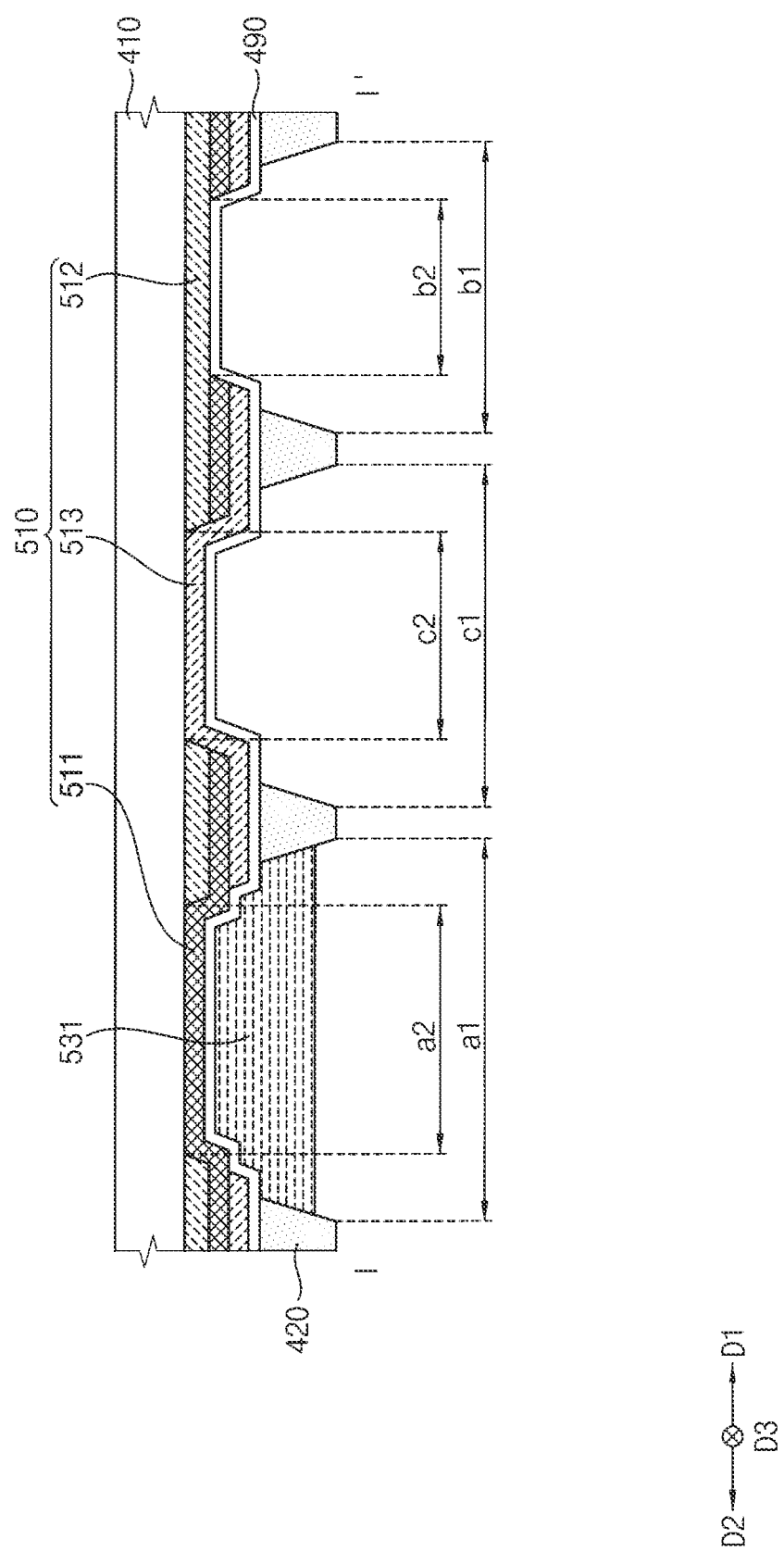

Referring to FIG. 17, the first optical filter 531 may be formed on the bottom surface of the second protective insulating layer 490 and in the first opening 420a of the light blocking member 420. Since the first optical filter 531 is formed in the first opening 420a having a circular shape, the first optical filter 531 may also have a circular shape. The first optical filter 531 may overlap the first color filter 511. The first optical filter 531 may convert blue light into red light. The first optical filter 531 may include a plurality of quantum dots configured to absorb blue light and emit red light. The first optical filter 531 may be formed using an inkjet process.

Figure 18:
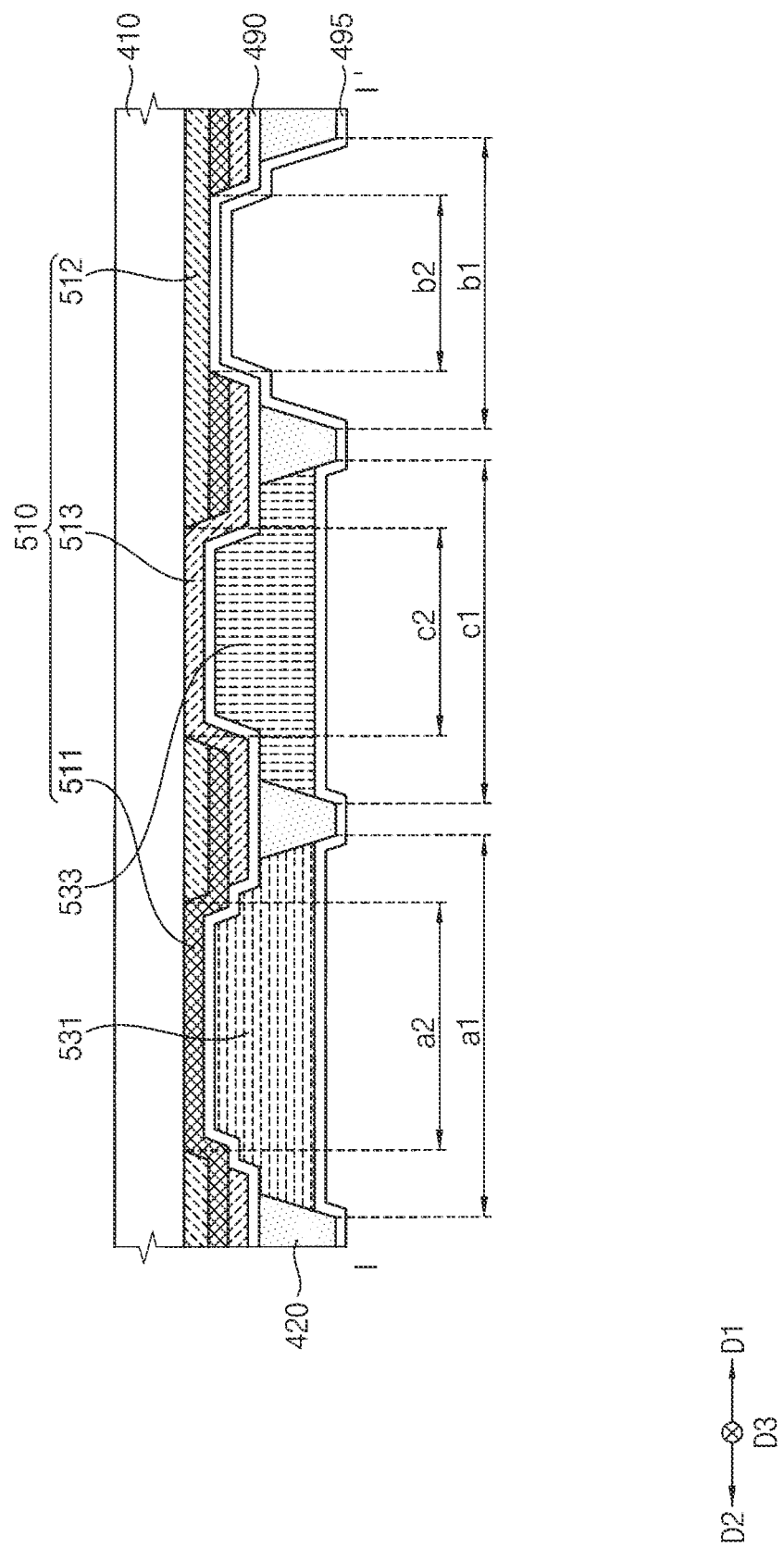

Referring to FIG. 18, the third optical filter 533 may be formed on the bottom surface of the second protective insulating layer 490 and in the third opening 420c of the light blocking member 420. Since the third optical filter 533 is formed in the third opening 420c having a circular shape, the third optical filter 533 may also have a circular shape. The third optical filter 533 may overlap the third color filter 513. The third optical filter 533 may convert blue light into green light. The third optical filter 533 may include a plurality of quantum dots configured to absorb blue light and emit green light. The third optical filter 533 may be formed using an inkjet process.

The quantum dots included in each of the first optical filter 531 and the third optical filter 533 may be formed of one nanocrystal among a silicon (Si)-based nanocrystal, a group II-VI-based compound semiconductor nanocrystal, a group III-V-based compound semiconductor nanocrystal, a group IV-VI-based compound semiconductor nanocrystal, and a mixture of some of the above materials.

The first protective insulating layer 495 may be formed under the first optical filter 531, the third optical filter 533, the light blocking member 420, and a part of the second protective insulating layer 490. The first protective insulating layer 495 may cover the first optical filter 531, the third optical filter 533, and the light blocking member 420 on the bottom surface of the second protective insulating layer 490. The second protective insulating layer 490 and the first protective insulating layer 495 may be spaced apart from each other by each of the first optical filter 531 and the third optical filter 533, and the second protective insulating layer 490 and the first protective insulating layer 495 may make contact with each other through the second opening 420b.

The first protective insulating layer 495 may be formed along a profile of the first optical filter 531, the third optical filter 533, and the light blocking member 420 with a uniform thickness to cover the first optical filter 531, the third optical filter 533, and the light blocking member 420 on the bottom surface of the second protective insulating layer 490. The first protective insulating layer 495 may be formed of an inorganic insulating material such as silicon nitride.

Figure 19:
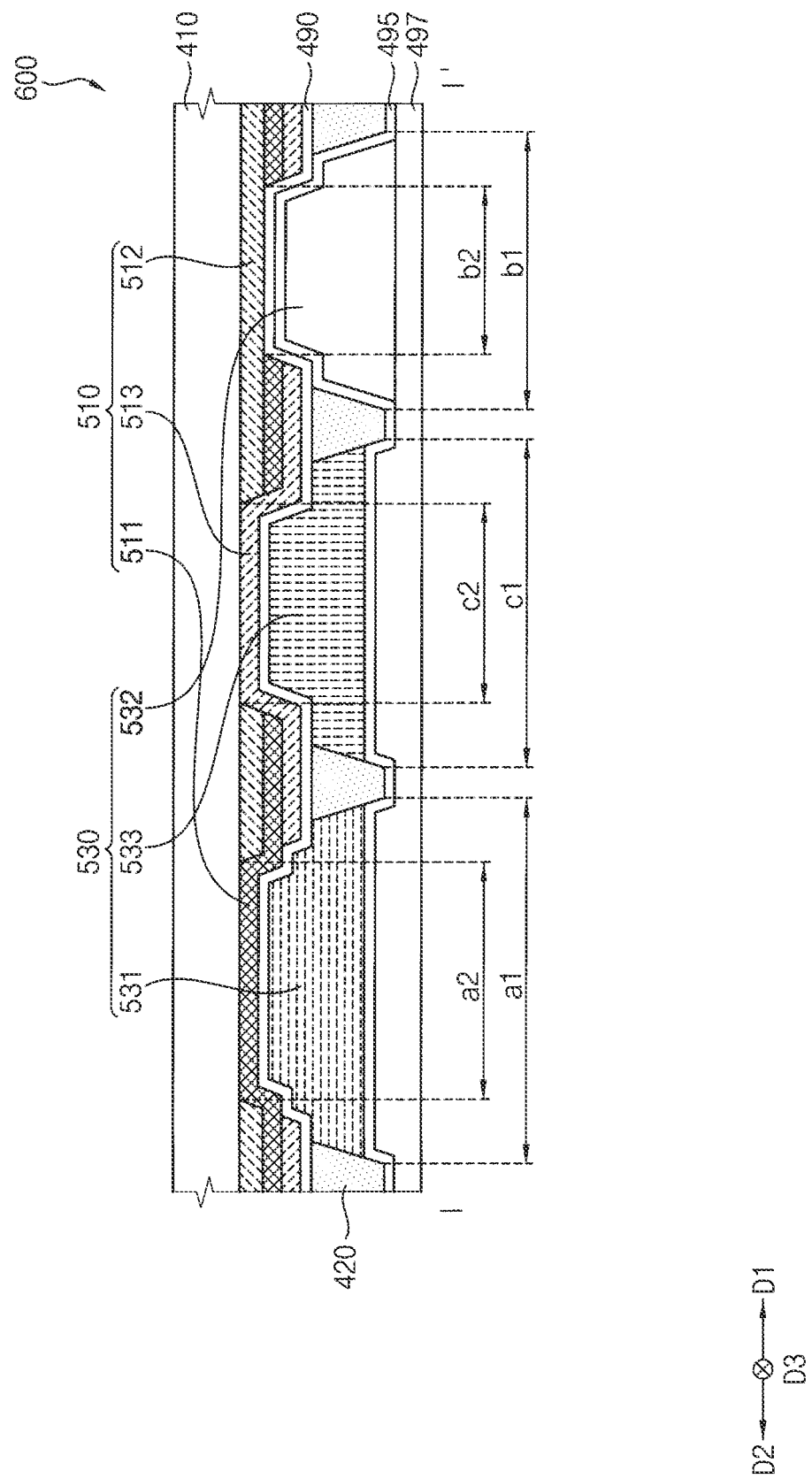

Referring to FIG. 19, the second optical filter 532 may be formed on a bottom surface of the first protective insulating layer 495 and in the second opening 420b of the light blocking member 420. Since the second optical filter 532 is formed in the second opening 420b having a rectangular shape, the second optical filter 532 may also have a rectangular shape. The area of the second optical filter 532 may be smaller than the area of each of the first optical filter 531 and the third optical filter 533. The second optical filter 532 may overlap the second color filter 512. The second optical filter 532 may be spaced apart from each of the first optical filter 531 and the third optical filter 533 by the light blocking member 420. The second optical filter 532 may transmit blue light. The second optical filter 532 may include a scattering material that emits blue light without significant color change. The second optical filter 532 may not include quantum dots.

The second optical filter 532 may be formed using a photolithography process that uses a negative photoresist. The second optical filter 532 may be formed by forming a negative photoresist over an entire area of the bottom surface of the first protective insulating layer 495, and irradiating light to a part of the negative photoresist. The bottom surface of the third optical filter 533 may be aligned with a lowest surface of the first protective insulating layer 495. Accordingly, a level of the bottom surface of the second optical filter 532 may not be coplanar with either of the level of the bottom surface of the first optical filter 531 and the level of the bottom surface of the third optical filter 533.

The second optical filter 532 may be formed of TiO, ZrO, $AlO_3$, $In_2O_3$, ZnO, $SnO_2$, $Sb_2O_3$, ITO, and the like.

Accordingly, the optical filters 530 including the first optical filter 531, the second optical filter 532, and the third optical filter 533 may be formed.

The intermediate layer 497 may be formed under the first protective insulating layer 495 and the second optical filter 532. The intermediate layer 497 may be formed on the bottom surface of the first protective insulating layer 495 to cover the second optical filter 532. The intermediate layer 497 may have a relatively thick thickness to sufficiently cover the second optical filter 532 on the bottom surface of the first protective insulating layer 495. The intermediate layer 497 may be formed of an organic insulating material, an inorganic insulating material, or the like.

Accordingly, the upper structure 600 including the second protective insulating layer 490, the first protective insulating layer 495, the optical filters 530, the intermediate layer 497, the color filters 510, the light blocking member 420, and the second substrate 410 may be provided.

A sealing member may be formed in the peripheral region 20 one the first substrate 110. The sealing member may be formed in the peripheral region 20 on the second substrate 410. The sealing member may be formed of a non-conductive material. The sealing member may include a frit or the like. The sealing member may additionally include a photocurable material. The sealing member may include a mixture of an organic material and a photocurable material. The photocurable material included in the sealing member may include an epoxy acrylate-based resin, a polyester acrylate-based resin, a urethane acrylate-based resin, a polybutadiene acrylate-based resin, a silicon acrylate-based resin, an alkyl acrylate-based resin, and the like.

Figure 20:
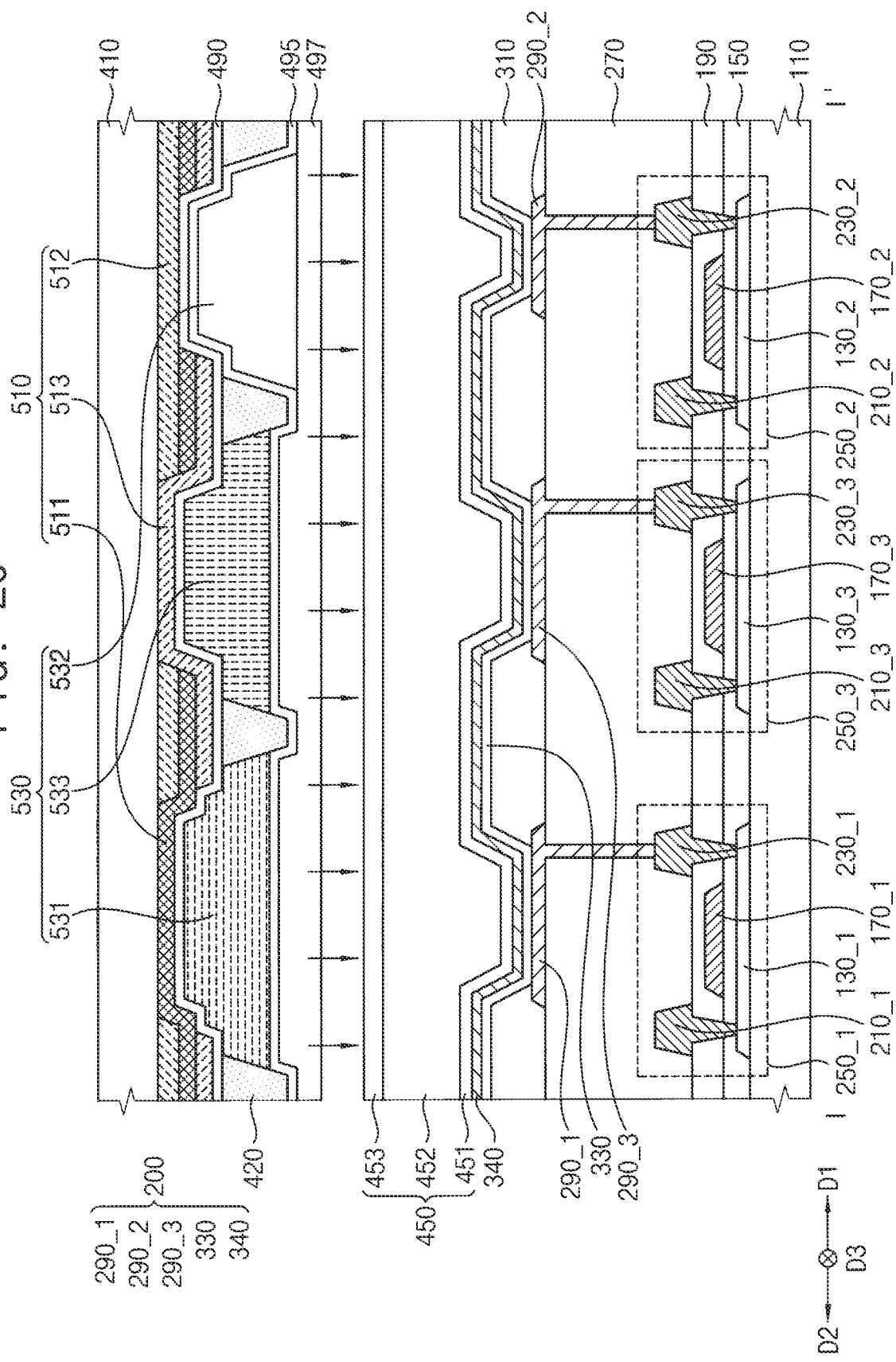

Referring to FIGS. 8 and 20, after the sealing member is formed, the bottom surface of the second substrate 410 may make contact with the sealing member. The lower structure 500 and the upper structure 600 may be coupled to each other.

Then, ultraviolet rays, laser light, visible light, or the like may be irradiated onto the sealing member. The laser light may be irradiated onto the sealing member. As the laser light is irradiated, the mixture may be changed from a solid state to a liquid state, and the mixture in the liquid state may be cured into the solid state after a predetermined time. The second substrate 410 may be coupled to the first substrate 110 and may be sealed with respect to the first substrate 110 according to the state change of the mixture.

Accordingly, the display device 100 shown in FIGS. 1 to 8 may be manufactured.

In the method of manufacturing the display device, the first opening 510a, the second opening 510b, and the third opening 510c may be defined by a part of the first color filter 511, a part of the second color filter 512, and a part of the third color filter 513 formed on both side portions of the first opening 510a, the second opening 510b, and the third opening 510c, respectively. In other words, since the part of the first color filter 511, the part of the second color filter 512, and the part of the third color filter 513 are formed on the both side portions of the first opening 510a, the second opening 510b, and the third opening 510c so as to define the first opening 510a, the second opening 510b, and the third opening 510c, respectively, it is unnecessary to add a light blocking pattern that defines the first opening 510a, the second opening 510b, and the third opening 510c to the display device 100 according to the present invention. Accordingly, a manufacturing cost of the display device 100 may be reduced.

In addition, since a width of each of the part of the first color filter 511, the part of the second color filter 512, and the part of the third color filter 513 formed on the both side portions of the first opening 510a, the second opening 510b, and the third opening 510c, respectively, is relatively wider than a width of the light blocking pattern, a process margin of the light blocking member 420 may be relatively increased. Accordingly, a process defect of the light blocking member 420 may be minimized or substantially prevented.

Since the second optical filter 532 is formed using a photolithography process that uses a negative photoresist that is relatively inexpensive, the manufacturing cost of the display device 100 may be minimized.

Figure 21:
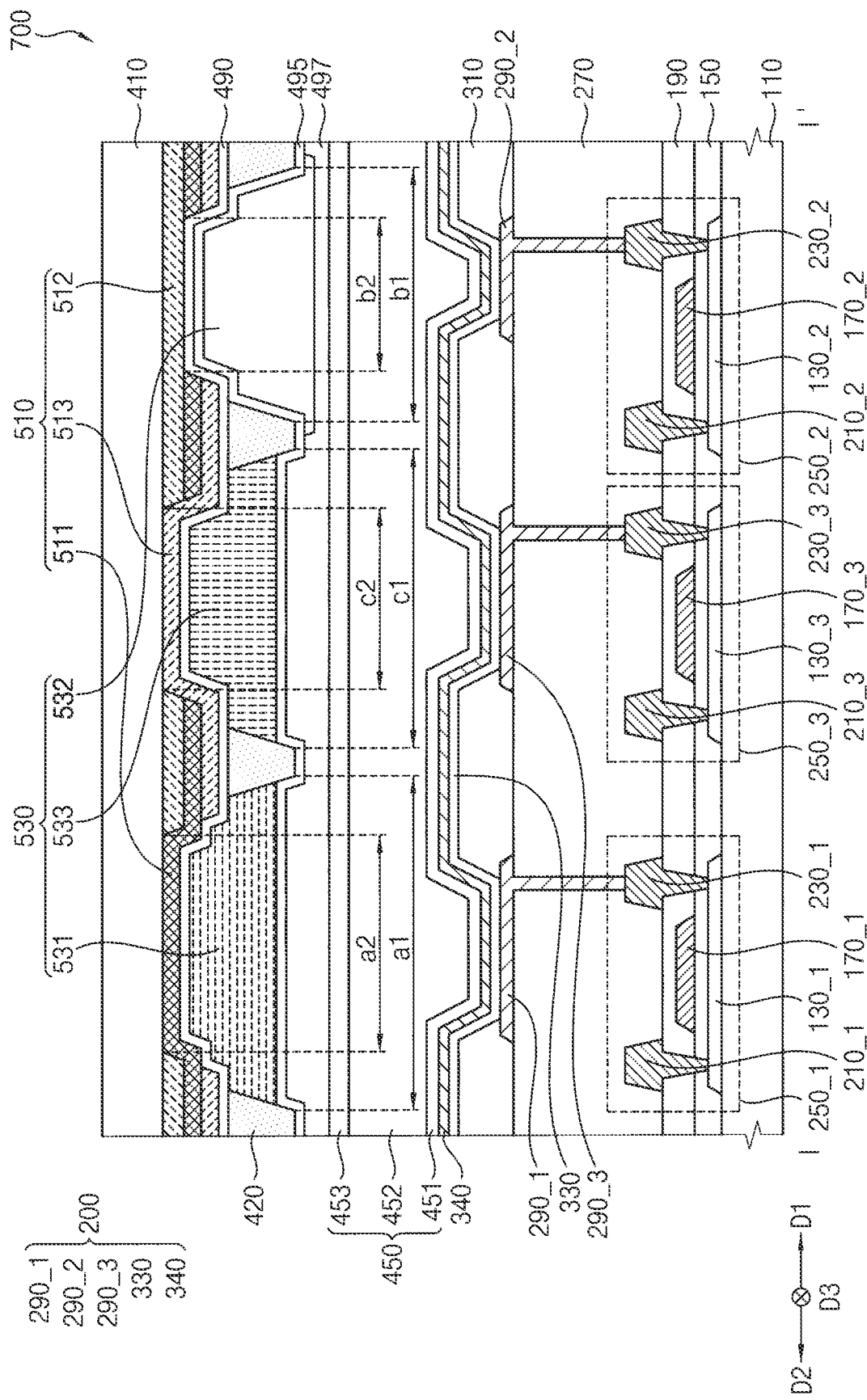
FIG. 21 is a cross-sectional view showing a display device according to embodiments.

FIG. 21 is a cross-sectional view showing a display device according to embodiments. A display device 700 illustrated in FIG. 21 may have structures that are substantially identical or similar to structures of the display device 100 described with reference to FIGS. 1 to 8 except for the shape of the second optical filter 532.

Referring to FIG. 21, the display device 700 may include a lower structure 500 and an upper structure 600.

The lower structure 500 may include a first substrate 110, a first semiconductor element 250_1, a second semiconductor element 250_2, a third semiconductor element 250_3, a gate insulating layer 150, an interlayer insulating layer 190, a planarization layer 270, a pixel structure 200, a pixel defining layer 310, a thin film encapsulation structure 450, and the like.

The upper structure 600 may include a first protective insulating layer 495, a second protective insulating layer 490, optical filters 530, an intermediate layer 497, color filters 510, a light blocking member 420, a second substrate 410, and the like. The optical filters 530 may include a first optical filter 531, a second optical filter 532, and a third optical filter 533. The color filters 510 may include a first color filter 511, a second color filter 512, and a third color filter 513.

The second optical filter 532 may be disposed on a bottom surface of the first protective insulating layer 495 and in the second opening 420b of the light blocking member 420. The second optical filter 532 may be disposed on the pixel structure 200 to overlap the second pixel electrode 290b. Referring to FIG. 6, since the second optical filter 532 is disposed in the second opening 420b having a rectangular shape, the second optical filter 532 may also have a rectangular shape. The area of the second optical filter 532 may be smaller than the area of each of the first optical filter 531 and the third optical filter 533. The second optical filter 532 may overlap the second color filter 512. The second optical filter 532 may be spaced apart from each of the first optical filter 531 and the third optical filter 533 by the light blocking part of the light blocking member 420. The second optical filter 532 may transmit blue light. The second optical filter 532 may include a scattering material that emits blue light with no significant color change. The second optical filter 532 may not include the quantum dots. Each of the first optical filter 531 and the third optical filter 533 may further include the scattering material.

Since the second optical filter 532 is disposed on the bottom surface of the first protective insulating layer 495, the top surface of the second optical filter 532 may not be coplanar with either of the top surface of the first optical filter 531 and the top surface of the third optical filter 533.

A part of the second optical filter 532 may be disposed on the bottom surface of the light blocking member 420. The second optical filter 532 may be formed by using a photolithography process that uses a negative photoresist. The second optical filter 532 may be formed by forming a negative photoresist over an entire area of the bottom surface of the first protective insulating layer 495, and irradiating light to a part of the negative photoresist. In this case, light may be irradiated over a relatively wide area so that the part of the second optical filter 532 may be formed on the bottom surface of the light blocking member 420. The level of the bottom surface of the second optical filter 532 may be different from each of the level of the bottom surface of the first optical filter 531 and the level of the bottom surface of the third optical filter 533. The bottom surface of the second optical filter 532 may be closer to the top surface of the thin film encapsulation structure 450 than each of the bottom surface of the first optical filter 531 and the bottom surface of the third optical filter 533.

The second optical filter 532 may include TiO, ZrO, $AlO_3$, $In_2O_3$, ZnO, $SnO_2$, $Sb_2O_3$, ITO, and the like.

Figure 22:
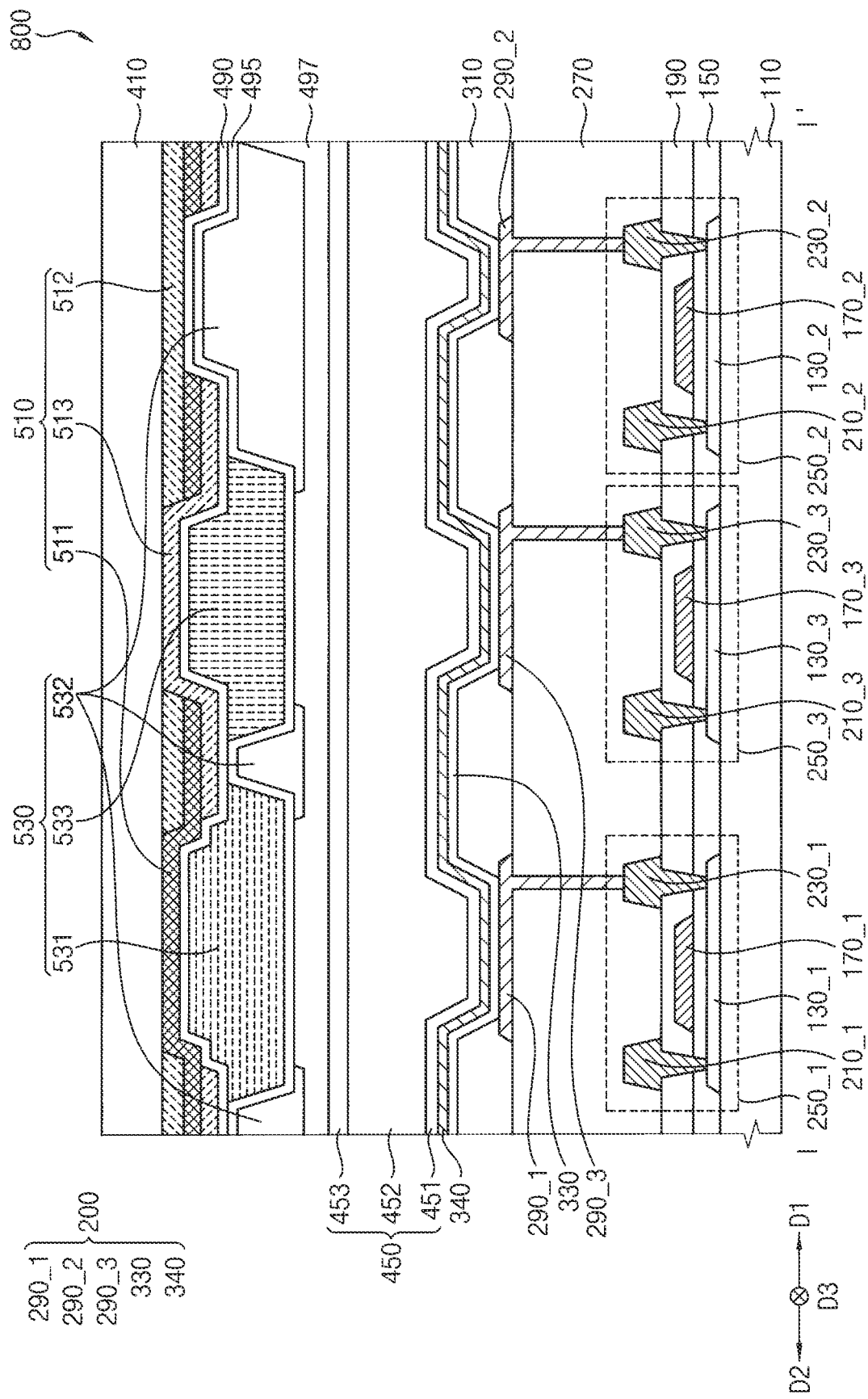
FIG. 22 is a cross-sectional view showing a display device according to embodiments.

FIG. 22 is a cross-sectional view showing a display device according to embodiments. A display device 800 illustrated in FIG. 22 may have structures that are substantially identical or similar to structures of the display device 100 described with reference to FIGS. 1 to 8 except for the shape of the second optical filter 532.

Referring to FIG. 22, the display device 800 may include a lower structure 500 and an upper structure 600.

The lower structure 500 may include a first substrate 110, a first semiconductor element 250_1, a second semiconductor element 250_2, a third semiconductor element 250_3, a gate insulating layer 150, an interlayer insulating layer 190, a planarization layer 270, a pixel structure 200, a pixel defining layer 310, a thin film encapsulation structure 450, and the like.

The upper structure 600 may include a first protective insulating layer 495, a second protective insulating layer 490, optical filters 530, an intermediate layer 497, color filters 510, a second substrate 410, and the like. The optical filters 530 may include a first optical filter 531, a second optical filter 532, and a third optical filter 533. The color filters 510 may include a first color filter 511, a second color filter 512, and a third color filter 513.

The first optical filter 531 may be disposed on the bottom surface of the second protective insulating layer 490 and in the first opening 510a of the color filters 510. The first optical filter 531 may be disposed on the pixel structure 200 to overlap the first pixel electrode 290a. The first optical filter 531 may have a circular shape. The first optical filter 531 may overlap the first color filter 511. The first optical filter 531 may be spaced apart from each of the second optical filter 532 and the third optical filter 533. The first optical filter 531 may convert blue light into red light. The first optical filter 531 may include a plurality of quantum dots configured to absorb blue light and emit red light.

The third optical filter 533 may be disposed on the bottom surface of the second protective insulating layer 490 and in the third opening 510c of the color filters 510. The third optical filter 533 may be disposed on the pixel structure 200 to overlap the third pixel electrode 290c. The third optical filter 533 may have a circular shape. The third optical filter 533 may overlap the third color filter 513. The third optical filter 533 may be spaced apart from each of the first optical filter 531 and the second optical filter 532. The third optical filter 533 may convert blue light into green light. The third optical filter 533 may include a plurality of quantum dots configured to absorb blue light and emit green light.

The first protective insulating layer 495 may be disposed under the first optical filter 531, the third optical filter 533, and the second protective insulating layer 490. The first protective insulating layer 495 may cover the first optical filter 531 and the third optical filter 533 on the bottom surface of the second protective insulating layer 490. The first protective insulating layer 495 may make contact with the second protective insulating layer 490 in a separation space between the first optical filter 531 and the third optical filter 533, and the second protective insulating layer 490 and the first protective insulating layer 495 may make contact with each other through the second opening 510b of the color filters 510. The first protective insulating layer 495 may be disposed along a profile of the first optical filter 531 and the second optical filter 532 with a uniform thickness to cover the first optical filter 531 and the second optical filter 532 on the bottom surface of the second protective insulating layer 490. The first protective insulating layer 495 may include an inorganic insulating material such as silicon nitride.

The second optical filter 532 may be disposed on the bottom surface of the first protective insulating layer 495 and in the second opening 510b of the color filters 510. The second optical filter 532 may be disposed on the pixel structure 200 to overlap the second pixel electrode 290b. The second optical filter 532 may cover each of the both side portions of the first optical filter 531 and the both side portions of the third optical filter 533, and may have openings that expose a part of the first optical filter 531 and a part of the third optical filter 533, respectively. The light emitted from the light emitting layer 330 may be incident onto each of the first optical filter 531 and the third optical filter 533 through the opening. The second optical filter 532 may also be disposed in the separation space between the first optical filter 531 and the third optical filter 533. The second optical filter 532 may also perform functions of the light blocking member 420 of FIG. 8. The second optical filter 532 may overlap the second color filter 512. The second optical filter 532 may transmit blue light. The second optical filter 532 may include a scattering material that emits blue light with no significant color change. The second optical filter 532 may not include the quantum dots. Each of the first optical filter 531 and the third optical filter 533 may further include the scattering material.

Since the second optical filter 532 is disposed on the bottom surface of the first protective insulating layer 495, the first protective insulating layer 495 may be disposed on a layer different from the layer of each of the first optical filter 531 and the third optical filter 533. A level of the bottom surface of the second optical filter 532 may be different from each of the level of the bottom surface of the first optical filter 531 and the level of the bottom surface of the third optical filter 533. The bottom surface of the second optical filter 532 may be closer to a top surface of the thin film encapsulation structure 450 as compared with the bottom surface of each of the first optical filter 531 and the third optical filter 533.

The second optical filter 532 may include TiO, ZrO, AlO$_3$, In$_2$O$_3$, ZnO, SnO$_2$, Sb$_2$O$_3$, ITO, and the like.

Since the display device 800 includes the first and third optical filters 531 and 533 having a circular shape, a relatively small amount of the light emitted from the light emitting layer 330 may be blocked. Accordingly, the display device 800 may have high light transmission efficiency.

FIGS. 23 to 28 are cross-sectional views showing structures formed in a method of manufacturing a display device according to embodiments. A method of manufacturing a display device illustrated in FIGS. 23 to 28 may have steps that are substantially identical or similar to steps of the method of manufacturing the display device described with reference to FIGS. 9 to 20.

Figure 23:
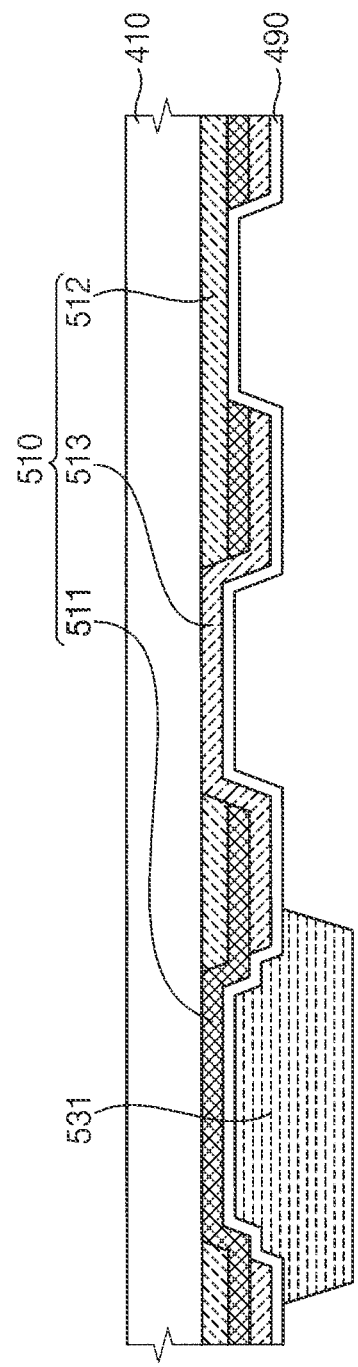
FIG. 23, FIG. 24, FIG. 25, FIG. 26, FIG. 27, and FIG. 28 are cross-sectional views showing structures formed in a method of manufacturing a display device according to embodiments.

Referring to FIGS. 15 and 23, the first optical filter 531 may be formed on the bottom surface of the second protective insulating layer 490 and in the first opening 510a of the color filters 510. The first optical filter 531 may have a circular shape. The first optical filter 531 may overlap the first color filter 511. The first optical filter 531 may convert blue light into red light. The first optical filter 531 may include a plurality of quantum dots configured to absorb blue light and emit red light. The first optical filter 531 may be formed using a photolithography process that uses a negative photoresist. The first optical filter 531 may be formed by forming a negative photoresist over an entire area of the bottom surface of the second protective insulating layer 490, and irradiating light to a part of the negative photoresist.

Figure 24:
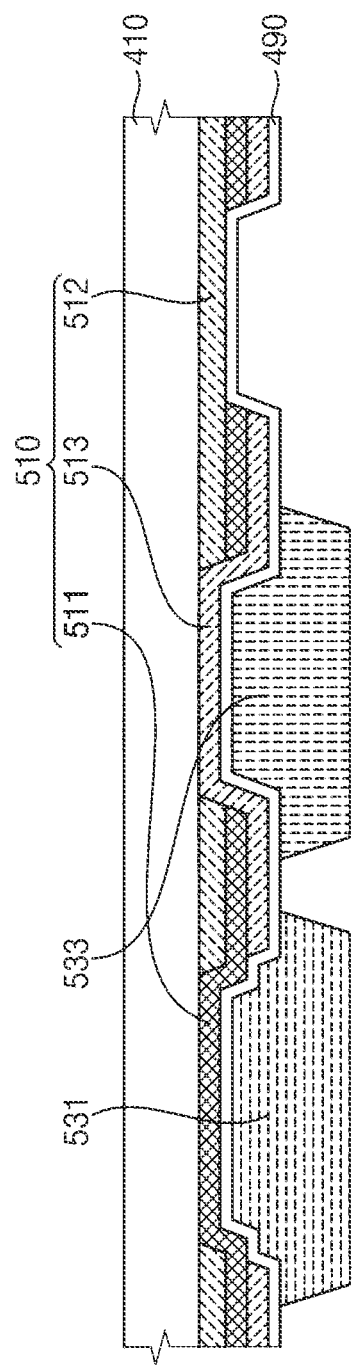

Referring to FIG. 24, the third optical filter 533 may be formed on the bottom surface of the second protective insulating layer 490 and in the third opening 510c of the color filters 510. The third optical filter 533 may have a circular shape. The third optical filter 533 may overlap the third color filter 513. The third optical filter 533 may be spaced apart from the first optical filter 531 in the first direction D1. The third optical filter 533 may convert blue light into green light. The third optical filter 533 may include a plurality of quantum dots configured to absorb blue light and emit green light. The third optical filter 533 may be formed using a photolithography process that uses a negative photoresist. The third optical filter 533 may be formed by forming a negative photoresist over an entire area of the bottom surface of the second protective insulating layer 490, and irradiating light to a part of the negative photoresist.

Figure 25:
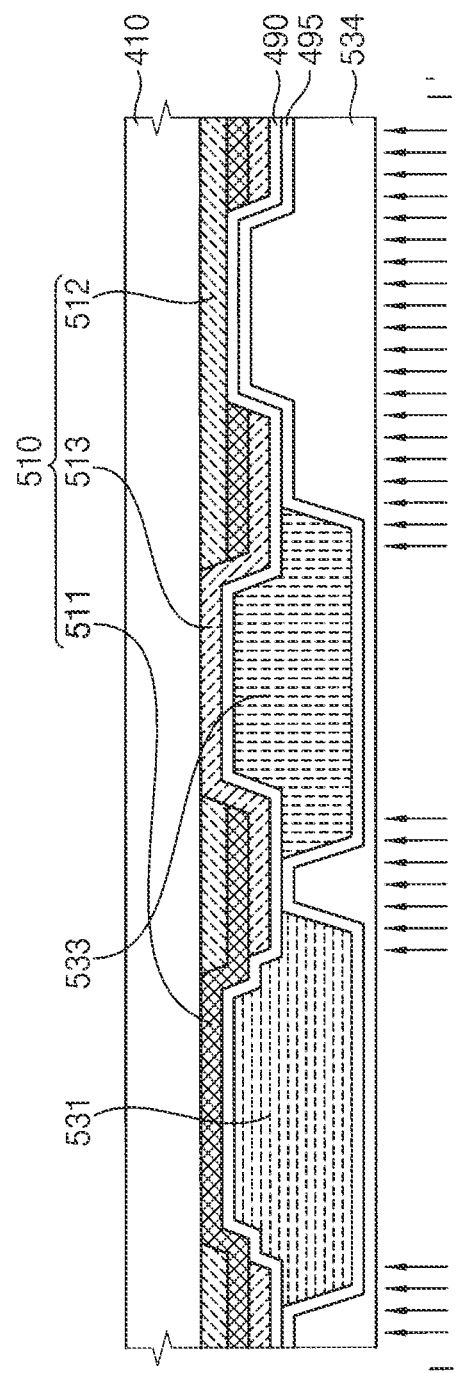

Referring to FIG. 25, the first protective insulating layer 495 may be formed under the first optical filter 531, the third optical filter 533, and the second protective insulating layer 490. The first protective insulating layer 495 may cover the first optical filter 531 and the third optical filter 533 on the bottom surface of the second protective insulating layer 490. The first protective insulating layer 495 may make contact with the second protective insulating layer 490 in a separation space between the first optical filter 531 and the third optical filter 533, and the second protective insulating layer 490 and the first protective insulating layer 495 may make contact with each other through the second opening 510*b* of the color filters 510. The first protective insulating layer 495 may be formed along a profile of the first optical filter 531 and the second optical filter 532 with a uniform thickness to cover the first optical filter 531 and the second optical filter 532 on the bottom surface of the second protective insulating layer 490. The first protective insulating layer 495 may be formed of an inorganic insulating material such as silicon nitride.

A negative photoresist 534 may be formed over an entire area of the bottom surface of the first protective insulating layer 495. After the negative photoresist 534 is formed, a part of the negative photoresist 534 may be irradiated with light.

Figure 26:
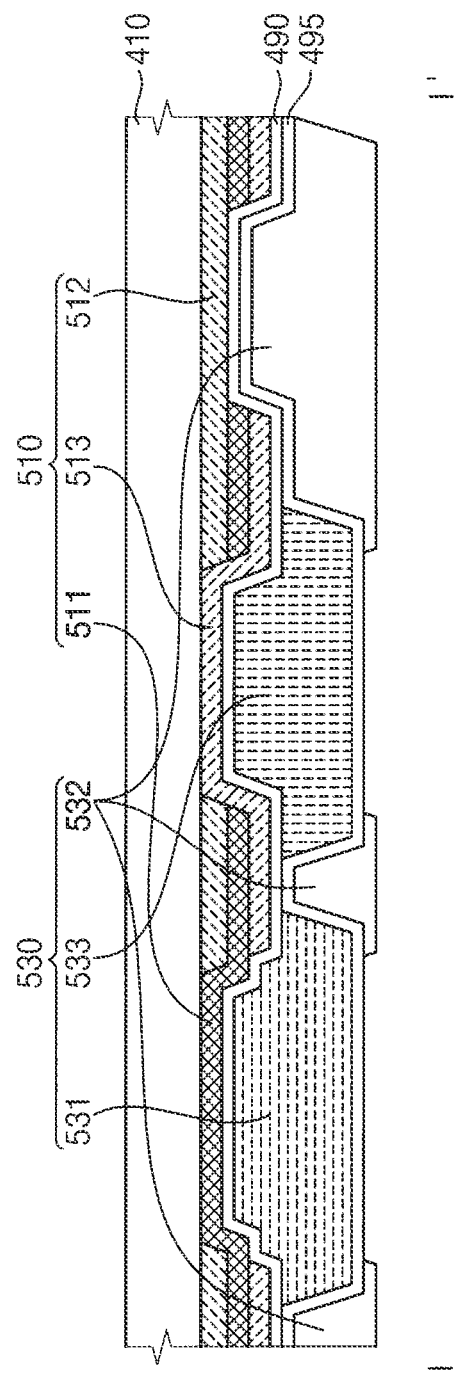

Referring to FIG. 26, the second optical filter 532 may be formed on the bottom surface of the first protective insulating layer 495 and in the second opening 510*b* of the color filters 510. The second optical filter 532 may cover each of the both side portions of the first optical filter 531 and the both side portions of the third optical filter 533, and may have openings that expose a part of the first optical filter 531 and a part of the third optical filter 533, respectively. The second optical filter 532 may also be formed in the separation space between the first optical filter 531 and the third optical filter 533. The second optical filter 532 may overlap the second color filter 512. The second optical filter 532 may transmit blue light. The second optical filter 532 may include a scattering material that emits blue light with no significant color change. The second optical filter 532 may not include quantum dots.

Accordingly, the optical filters 530 including the first optical filter 531, the second optical filter 532, and the third optical filter 533 may be formed.

Figure 27:
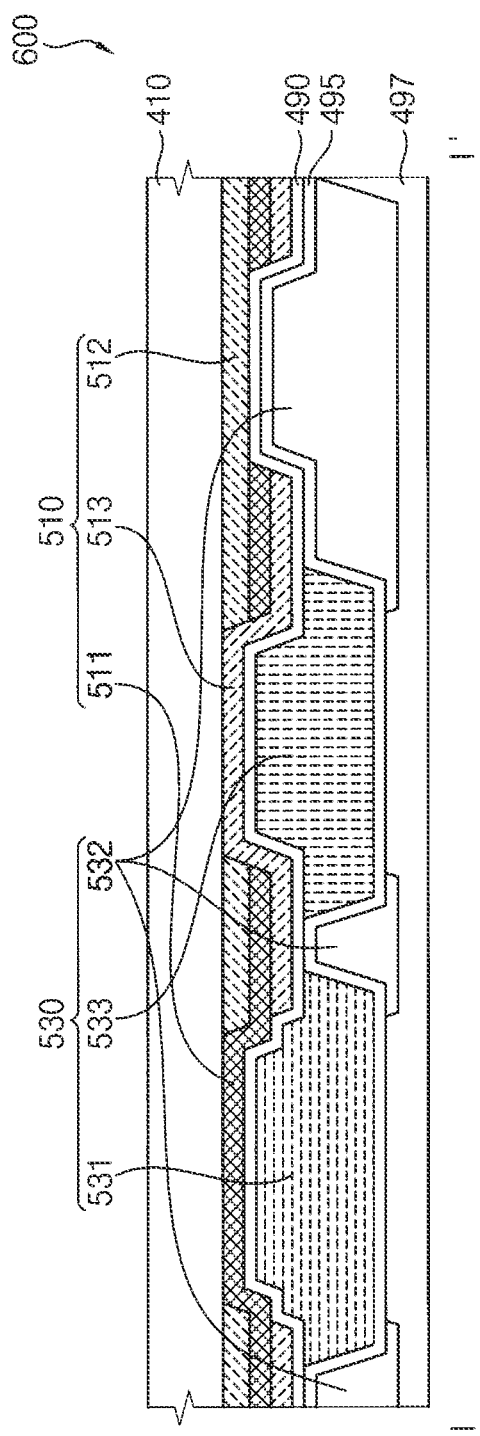

Referring to FIG. 27, the intermediate layer 497 may be formed under the first protective insulating layer 495 and the second optical filter 532. The intermediate layer 497 may be formed on the bottom surface of the first protective insulating layer 495 to cover the second optical filter 532. The intermediate layer 497 may have a relatively thick thickness to sufficiently cover the second optical filter 532 on the bottom surface of the first protective insulating layer 495. The intermediate layer 497 may be formed of an organic insulating material, an inorganic insulating material, or the like.

Accordingly, the upper structure 600 including the second protective insulating layer 490, the first protective insulating layer 495, the optical filters 530, the intermediate layer 497, the color filters 510, and the second substrate 410 may be provided.

A sealing member may be formed in the peripheral region 20 one the first substrate 110. The sealing member may be formed in the peripheral region 20 on the second substrate 410. The sealing member may be formed of a non-conductive material. The sealing member may include a frit or the like. The sealing member may additionally include a photocurable material. The sealing member may include a mixture of an organic material and a photocurable material. The photocurable material included in the sealing member may include an epoxy acrylate-based resin, a polyester acrylate-based resin, a urethane acrylate-based resin, a polybutadiene acrylate-based resin, a silicon acrylate-based resin, an alkyl acrylate-based resin, and the like.

Figure 28:
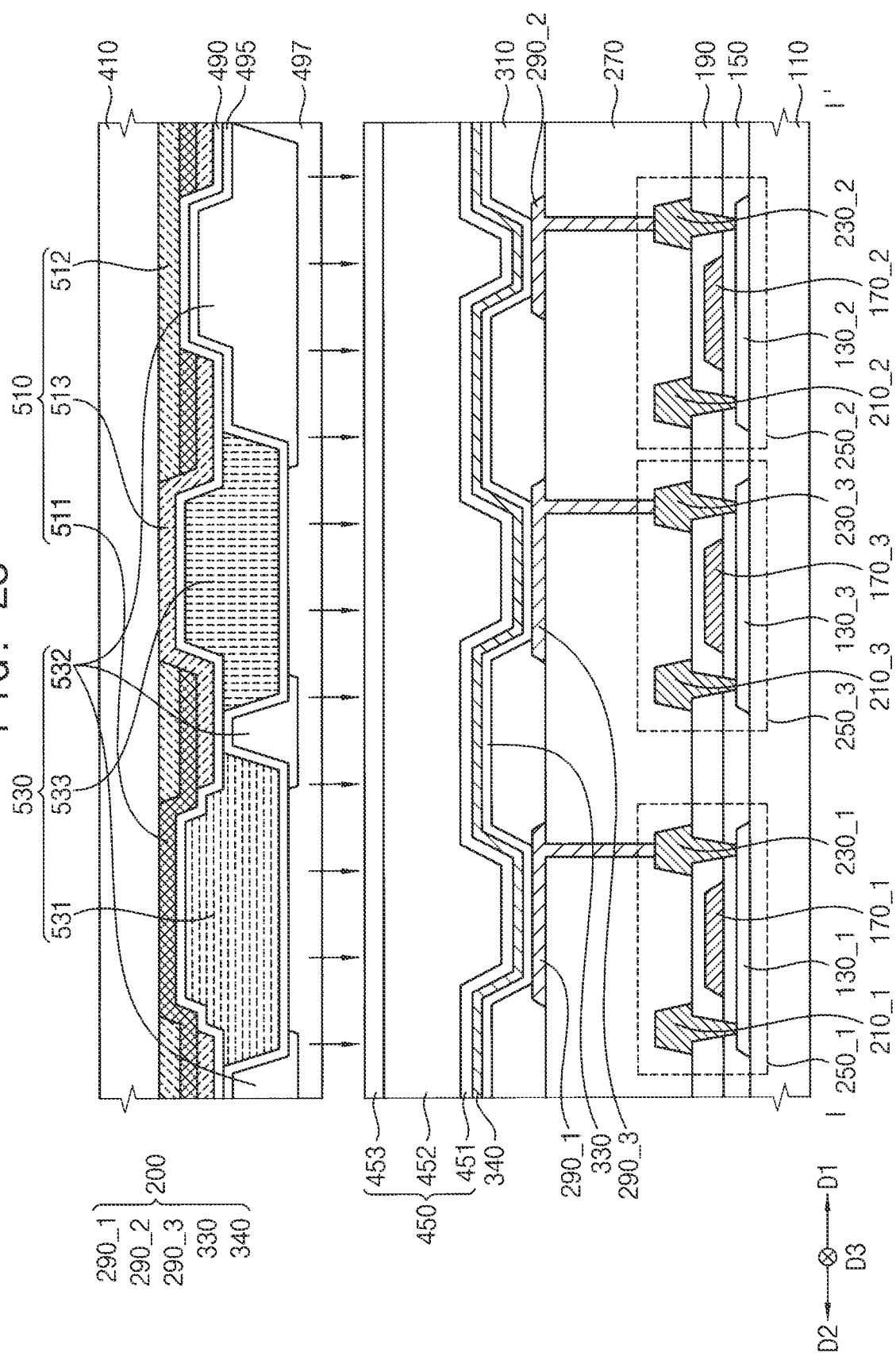

Referring to FIGS. 22 and 28, after the sealing member is formed, the bottom surface of the second substrate 410 may make contact with the sealing member. The lower structure 500 and the upper structure 600 may be coupled to each other.

Then, ultraviolet rays, laser light, visible light, or the like may be irradiated onto the sealing member. The laser light may be irradiated onto the sealing member. As the laser light is irradiated, the mixture may be changed from a solid state to a liquid state, and the mixture in the liquid state may be cured into the solid state after a predetermined time. The second substrate 410 may be coupled to the first substrate 110 and may be sealed with respect to the first substrate 110 according to the state change of the mixture.

Accordingly, the display device 800 shown in FIG. 23 may be manufactured.

In the method of manufacturing the display device, since the optical filters 530 are formed using a photolithography process that uses a negative photoresist that is relatively inexpensive, a manufacturing cost of the display device 800 may be reduced.

In addition, when compared to the display device 100 of FIG. 8, the light blocking member 420 is not formed, so that the manufacturing cost of the display device 800 may be further reduced.

Figure 29:
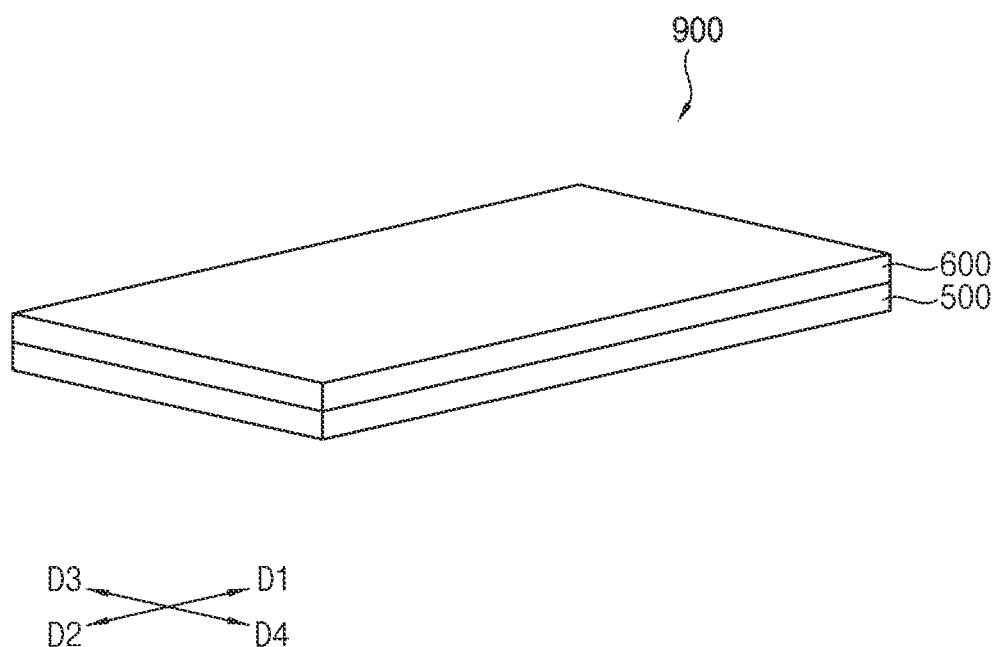
FIG. 29 is a perspective view showing a display device according to embodiments.
Figure 30:
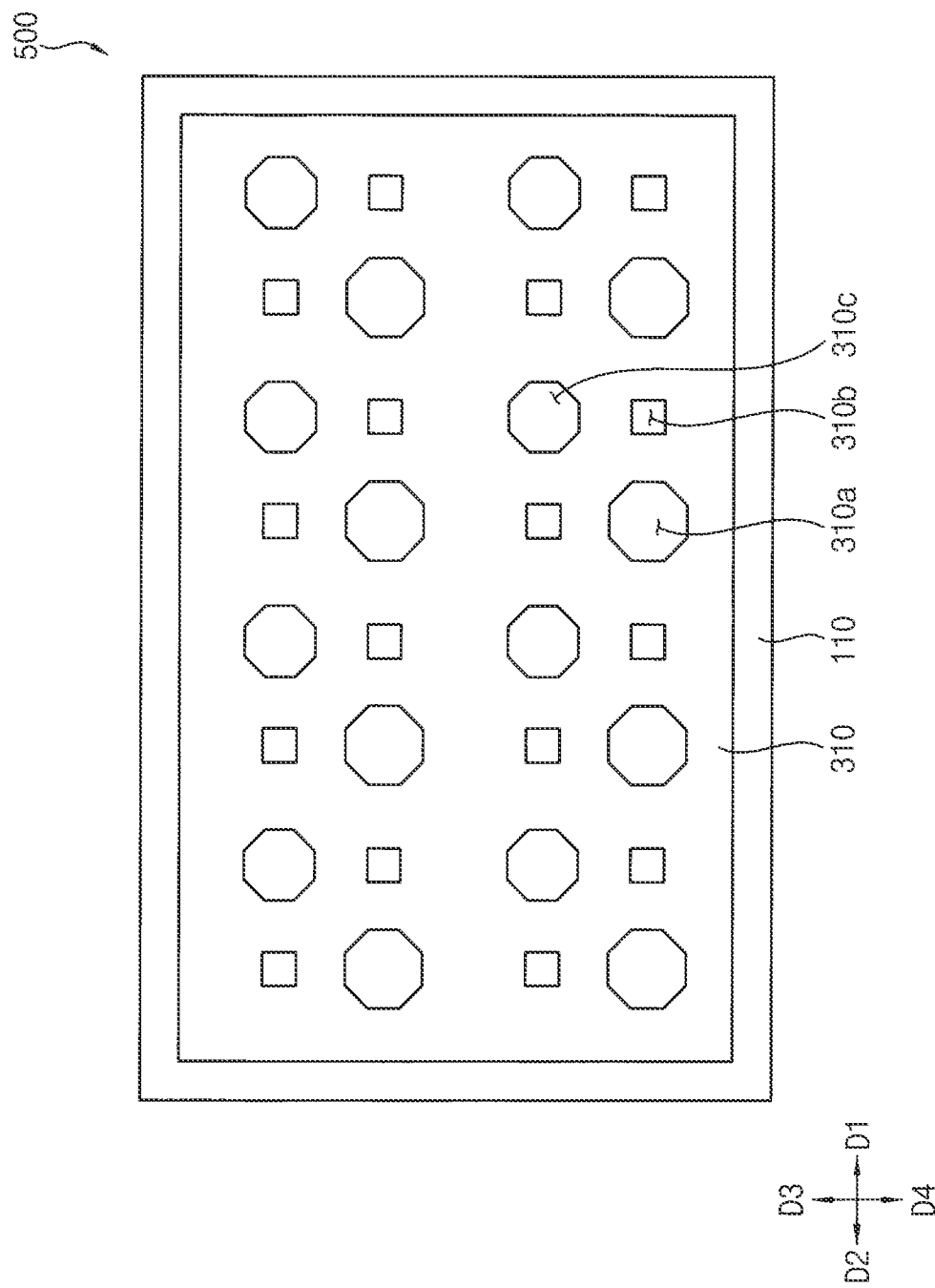
FIG. 30 is a plan view illustrating a pixel defining layer included in the display device of FIG. 29 according to embodiments.
Figure 31:
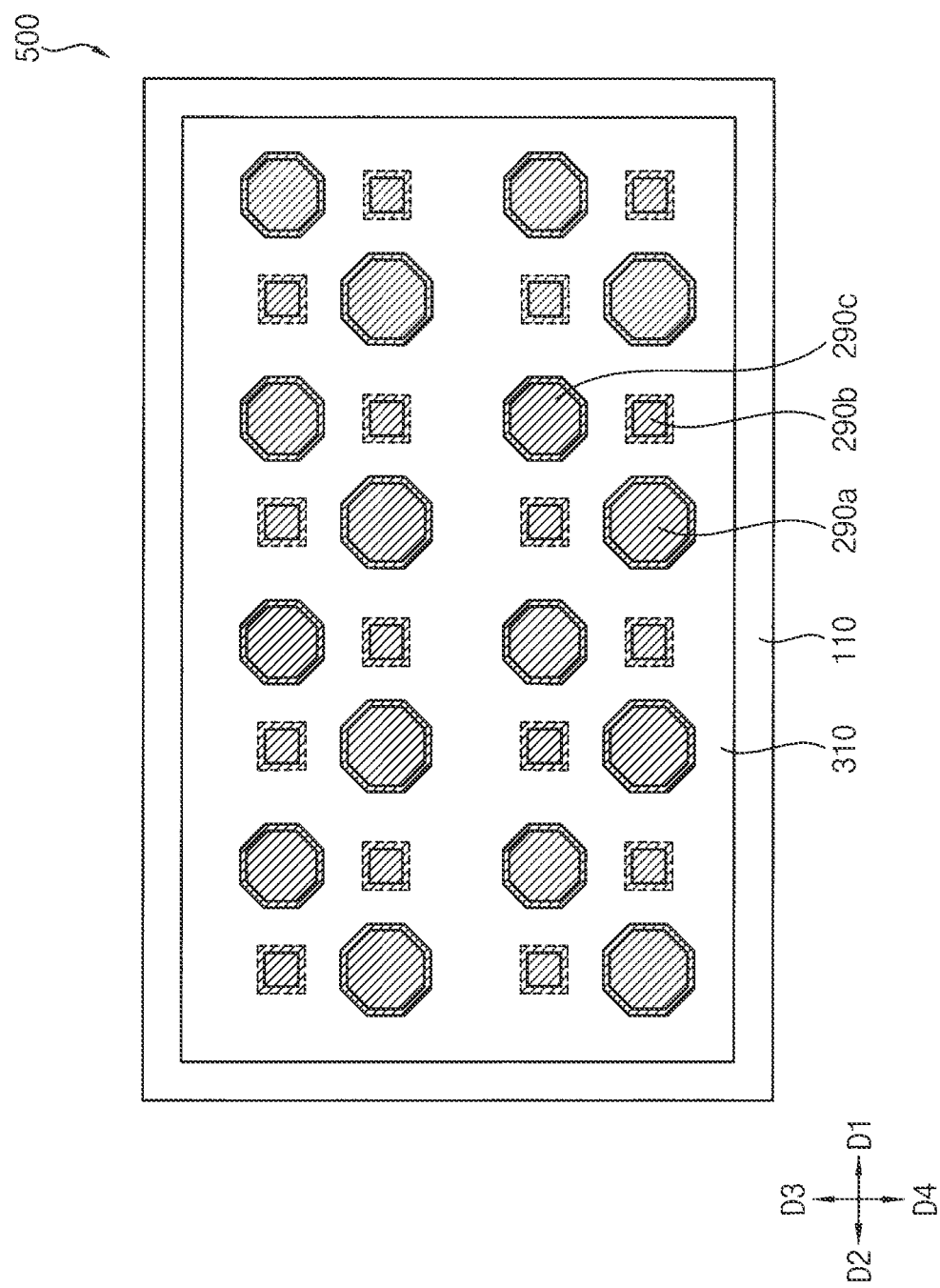
FIG. 31 is a plan view showing the pixel defining layer and a lower electrode included in the display device of FIG. 29 according to embodiments.
Figure 32:
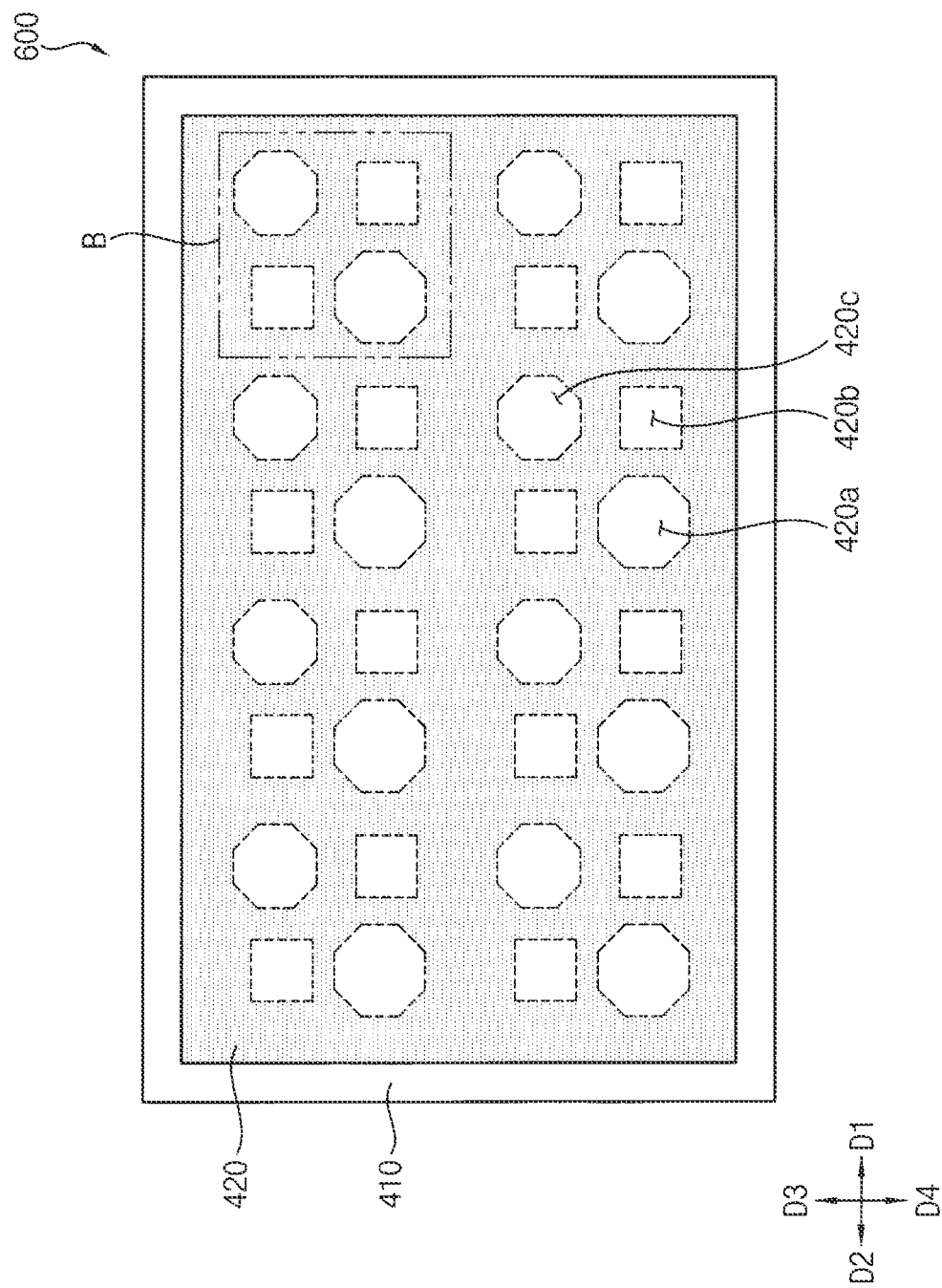
FIG. 32 is a plan view illustrating a light blocking member included in the display device of FIG. 29 according to embodiments.
Figure 33:
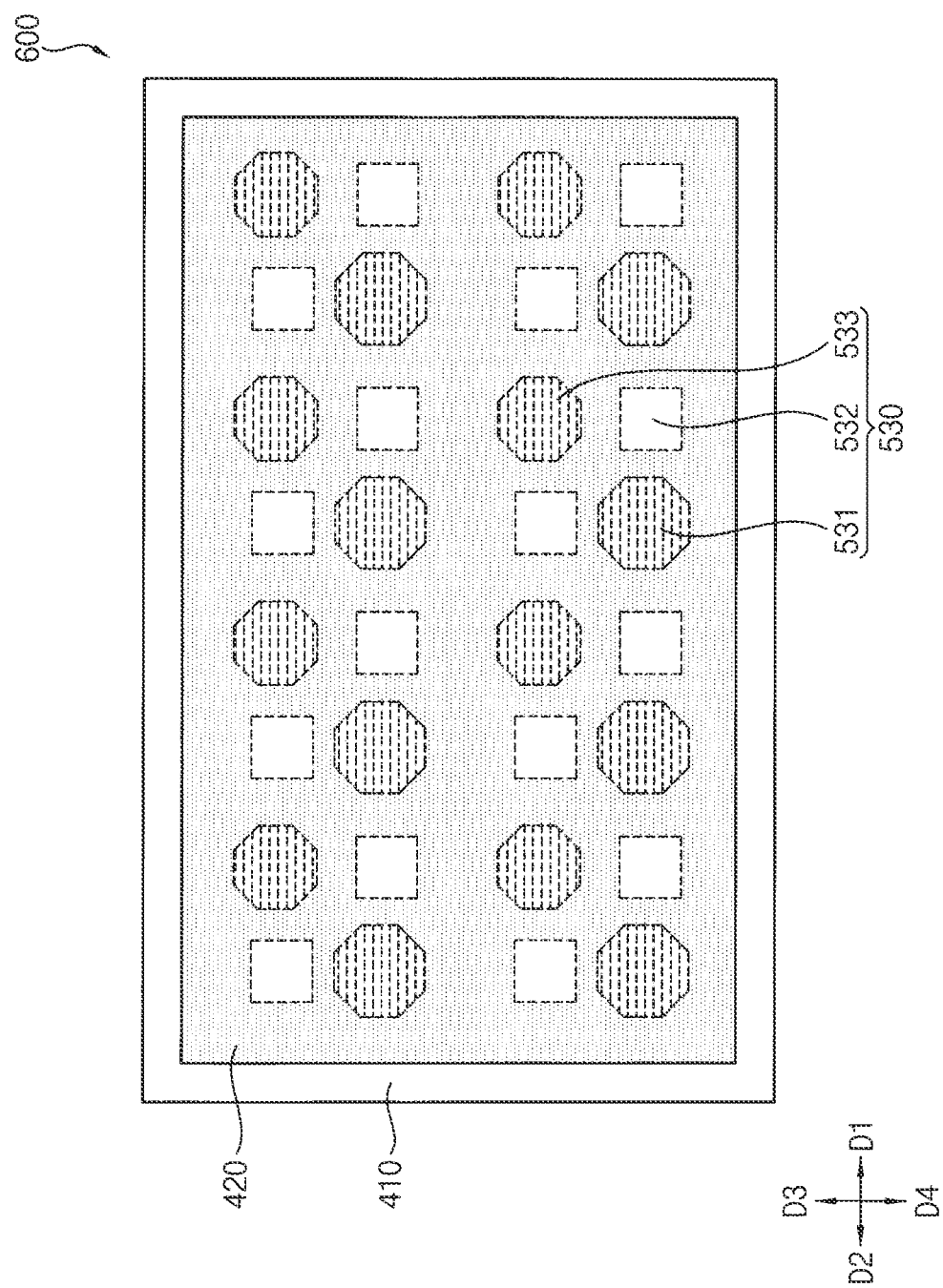
FIG. 33 is a plan view showing the light blocking member, a first optical filter, a second optical filter, and a third optical filter included in the display device of FIG. 29 according to embodiments.
Figure 34:
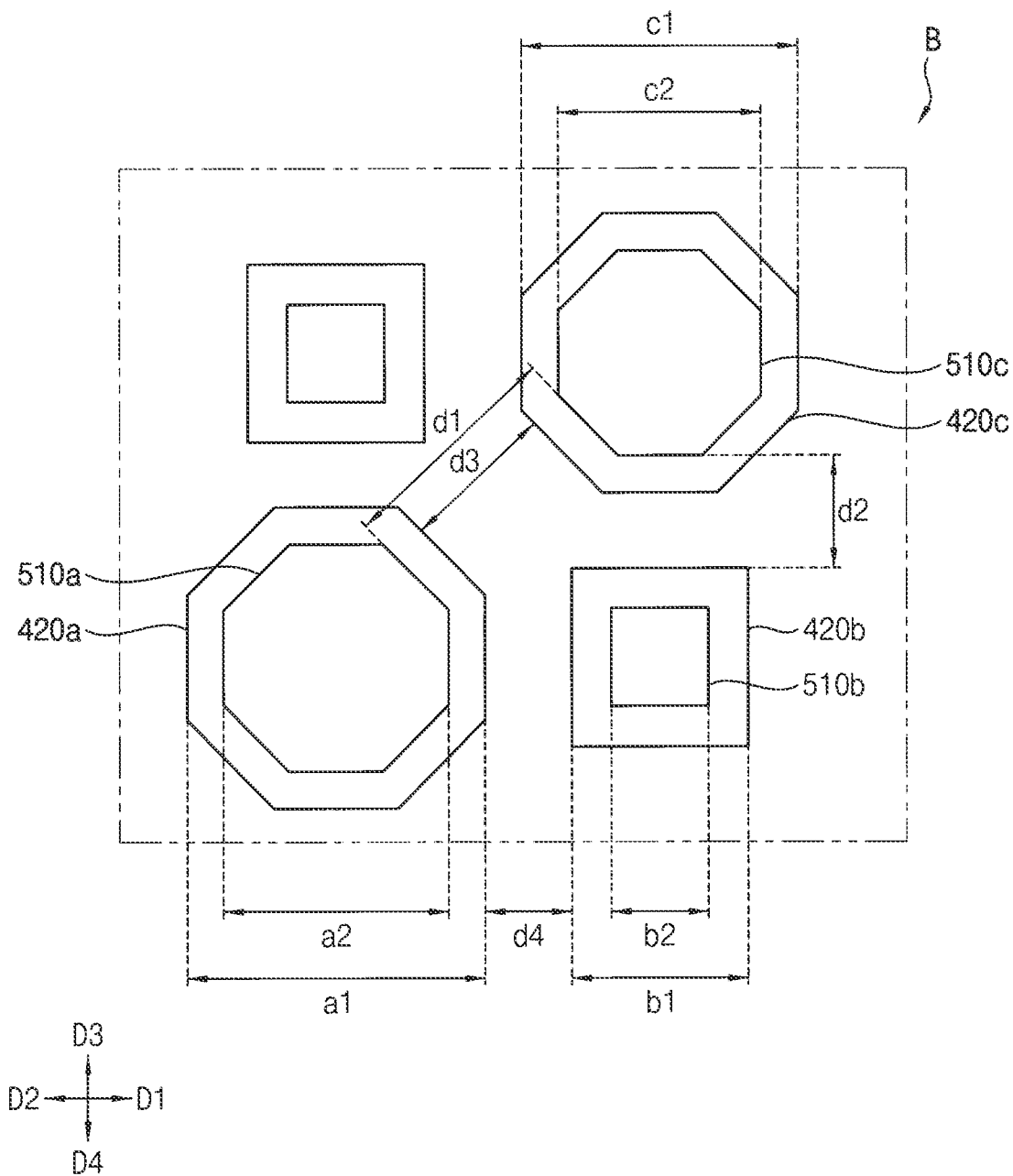
FIG. 34 is a plan view showing 'B' region of FIG. 32 according to embodiments.

FIG. 29 is a perspective view showing a display device according to embodiments, and FIG. 30 is a plan view illustrating a pixel defining layer included in the display device of FIG. 29. FIG. 31 is a plan view showing a state in which the pixel defining layer and a lower electrode included in the display device of FIG. 29 overlap each other, and FIG. 32 is a plan view illustrating a light blocking member included in the display device of FIG. 29. FIG. 33 is a plan view showing a state in which the light blocking member, a first optical filter, a second optical filter, and a third optical filter included in the display device of FIG. 29 overlap each other, and FIG. 34 is a partially enlarged plan view showing 'B' region of FIG. 32.

A display device 900 illustrated in FIGS. 29 to 34 may have structures that are substantially identical or similar to structures of the display device 100 described with reference to FIGS. 1 to 8 except for the shape of the opening of the pixel defining layer 310, the shape of the lower electrode 290, the shape of the opening of the light blocking member 420, and the shapes of the optical filters 530.

Referring to FIGS. 29, 30, 31, 32, and 33, the display device 900 may include a lower structure 500 and an upper structure 600. The lower structure 500 and the upper structure 600 may make direct contact with each other, and may be hermetically coupled to each other by a sealing member disposed on an outermost periphery of the display device 900.

As shown in FIGS. 30 and 31, the lower structure 500 may include a first substrate 110, a pixel defining layer 310, first, second, and third pixel electrodes 290*a*, 290*b*, and 290*c*, and the like. The first, second, and third pixel electrodes 290*a*, 290*b*, and 290*c* may be disposed on the first substrate 110, and the pixel defining layer 310 may overlap a part of each of the first, second, and third pixel electrodes 290a, 290b, and 290c. The pixel defining layer 310 may have an opening that exposes a part of each of the first, second, and third pixel electrodes 290a, 290b, and 290c. The pixel defining layer 310 may include a first polygonal opening 310a, a rectangular opening 310b, and a second polygonal opening 310c. The first polygonal opening 310a may expose a part of the first pixel electrode 290a, the rectangular opening 310b may expose a part of the second pixel electrode 290b, and the second polygonal opening 310c may expose a part of the third pixel electrode 290c.

In a plan view of the display device 900, each of the first pixel electrode 290a and the third pixel electrode 290c may have a polygonal shape, and the second pixel electrode 290b may have a rectangular shape. The polygon may include a polygon (e.g., a regular octagon, etc.) that is symmetrical about a center of the polygon, or substantially close to a circle.

One of the first pixel electrode 290a and the third pixel electrode 290c may have a shape of a first polygon, and a remaining one may have a shape of a second polygon that is different from the first polygon. One of the first pixel electrode 290a and the third pixel electrode 290c may have a polygonal shape, and the remaining one may have a rectangular shape.

As shown in FIGS. 32 and 33, the upper structure 600 may include a second substrate 410, a light blocking member 420, optical filters 530 (including a first optical filter 531, a second optical filter 532, and a third optical filter 533), and the like. The light blocking member 420 may be disposed on a bottom surface of the second substrate 410, and the light blocking member 420 may include a first opening 420a, a second opening 420b, and a third opening 420c.

In a plan view of the display device 900 (or from a direction perpendicular to a top surface of the second substrate 410), each of the first opening 420a and the third opening 420c may have a polygonal shape, and the second opening 420b may have a rectangular shape. The first optical filter 531 may be disposed in the first opening 420a, the second optical filter 532 may be disposed in the second opening 420b, and the third optical filter 533 may be disposed in the third opening 420c. Since each of the first opening 420a and the third opening 420c has a polygonal shape, and the second opening 420b has a rectangular shape, each of the first optical filter 531 and the third optical filter 533 may also have a polygonal shape, and the second optical filter 532 may also have a rectangular shape. The polygon may include a polygon (e.g., a regular octagon, etc.) that is symmetrical about a center of the polygon, or substantially close to a circle.

The first opening 420a, the second opening 420b, and the third opening 420c may overlap (or correspond to) the first polygonal opening 310a, the rectangular opening 310b, and the second polygonal opening 310c, respectively, and sizes of the first opening 420a, the second opening 420b, and the third opening 420c may be larger than sizes of the first polygonal opening 310a, the rectangular opening 310b, and the second polygonal opening 310c, respectively.

A light emitting layer may be disposed in the first polygonal opening 310a, the rectangular opening 310b, and the second polygonal opening 310c of the pixel defining layer 310, and light emitted from the light emitting layer may pass through the optical filters 530 disposed in each of the first opening 420a, the second opening 420b, and the third opening 420c of the light blocking member 420 so as to be emitted to an outside of the display device 900.

One of the first opening 420a and the third opening 420c may have a shape of a first polygon, and a remaining one may have a shape of a second polygon that is different from the first polygon. One of the first opening 420a and the third opening 420c may have a polygonal shape, and the remaining one may have a rectangular shape.

One of the first optical filter 531 and the third optical filter 533 may have a shape of a first polygon, and a remaining one may have a shape of a second polygon that is different from the first polygon. One of the first optical filter 531 and the third optical filter 533 may have a polygonal shape, and the remaining one may have a rectangular shape.

Referring to FIGS. 8, 15, 16, and 34, the first opening 420a may have a first width a1, the second opening 420b may have a second width b1, and the third opening 420c may have a third width c1. The first width a1 may be greater than the second width b1, and the third width c1 may be greater than the second width b1. The first width a1 may be greater than the third width c1. The first width a1 may be approximately 113 micrometers, the second width b1 may be greater than approximately 38 micrometers, and the third width c1 may be approximately 109 micrometers. A separation distance d3 from the first opening 420a to the third opening 420c may be approximately 20 micrometers, a separation distance d4 from the first opening 420a to the second opening 420b may be approximately 22 micrometers, and a separation distance from the third opening 420c to the second opening 420b may be approximately 22 micrometers.

The first opening 510a may have a fourth width a2, the second opening 510b may have a fifth width b2, and the third opening 510c may have a sixth width c2. The fourth width a2 may be greater than the fifth width b2, and the sixth width c2 may be greater than the fifth width b2. The fourth width a2 may be greater than the sixth width c2. The fourth width a2 may be approximately 77 micrometers, the fifth width b2 may be approximately 38 micrometers, and the sixth width c2 may be approximately 73 micrometers. A separation distance d1 from the first opening 510a to the third opening 510c may be approximately 56 micrometers, a separation distance from the first opening 510a to the second opening 510b may be approximately 40 micrometers, and a separation distance from the third opening 510c to the second opening 510b may be approximately 40 micrometers.

Since the display device 900 includes the first and third optical filters 531 and 533 having a polygonal shape that is substantially close to a circle, a length of a perimeter of a polygon that is close to the circle is shorter than a length of a perimeter of an asymmetric polygon based on a preset area, so that the light blocking member 420 including the first and third openings 420a and 430c having a polygonal shape that is substantially close to a circle, in which the first and third optical filters 531 and 533 are disposed in the first and third openings 420a and 430c, respectively, may cause a relatively small light loss. A relatively small amount of the light emitted from the light emitting layer 330 may be blocked from the light blocking member 420. Advantageously, the display device 900 may have high light transmission efficiency.

Embodiments may be applied to various electronic devices.

Although example embodiments have been described, many modifications are possible in the example embodiments. Accordingly, all such modifications are intended to be included within the scope defined in the claims.

What is claimed is:

1. A display device comprising:
   a first transistor;
   a second transistor;
   a third transistor;
   a first electrode electrically connected to the first transistor;
   a second electrode electrically connected to the second transistor;
   a third electrode electrically connected to the third transistor;
   a first optical filter overlapping the first electrode and having a first circular perimeter in a plan view of the display device;
   a second optical filter overlapping the second electrode, having a polygonal perimeter in the plan view of the display device, and being spaced from the first optical filter; and
   a third optical filter overlapping the third electrode, being spaced apart from each of the first optical filter and the second optical filter, and having a second circular perimeter in the plan view of the display device,
   wherein the second optical filter is configured to transmit first light of a first color, wherein the first optical filter is configured to convert second light of the first color into light of a second color, wherein the third optical filter is configured to convert third light of the first color into light of a third color, and wherein the first color, the second color, and the third color are different from each other.

2. The display device of claim 1, wherein the first optical filter is larger than the second optical filter in the plan view of the display device.

3. The display device of claim 1, wherein the third optical filter is larger than the second optical filter in the plan view of the display device.

4. The display device of claim 1, further comprising:
   a light emitting layer overlapping each of the first electrode and the second electrode, being disposed between the first electrode and the first optical filter, and being disposed between the second electrode and the second optical filter; and
   a common electrode overlapping the light emitting layer, being disposed between the light emitting layer and the first optical filter, and being disposed between the light emitting layer and the second optical filter,
   wherein the first electrode, the second electrode, the light emitting layer, and the common are defined as a pixel structure, and the pixel structure is configured to emit fourth light of the first color.

5. The display device of claim 4, wherein the first electrode has a circular boundary in the plan view of the display device, and wherein the second electrode has a polygonal boundary in the plan view of the display device.

6. The display device of claim 5, wherein, in the plan view of the display device, the first circular perimeter surrounds the circular boundary, and wherein the polygonal perimeter surrounds the polygonal boundary.

7. The display device of claim 6, wherein the first electrode is larger than the second electrode in the plan view of the display device.

8. The display device of claim 1, further comprising a light blocking member including at least one opening, wherein at least one of the first optical filter and the second optical filter is at least partially disposed inside the at least one opening.

9. The display device of claim 8, wherein the at least one opening includes a first opening and a second opening, wherein the first optical filter is at least partially disposed inside the first opening, and wherein the second optical filter is at least partially disposed inside the second opening.

10. The display device of claim 9, wherein the first opening is larger than the second opening in the plan view of the display device.

11. The display device of claim 9, wherein the light blocking member includes a light blocking section positioned between the first opening and the second opening, and wherein a part of the second optical filter is disposed outside the second opening and overlaps the light blocking section.

12. The display device of claim 9, further comprising a first substrate, wherein each of the first optical filter and the second optical filter overlaps the first substrate, wherein a face of the first optical filter faces the first substrate, and wherein a face of the second optical filter faces the first substrate and is positioned closer to or farther from the first substrate than the face of the first optical filter.

13. The display device of claim 9, further comprising:
    a first substrate, wherein each of the first optical filter and the second optical filter overlaps the first substrate;
    a first protective insulating layer, wherein a face of the light blocking member faces the first substrate and directly contacts the first protective insulating layer.

14. The display device of claim 13, wherein a section of the first protective insulating layer is disposed between the first optical filter and the substrate and directly contacts the first optical filter, and wherein no section of the first protective insulating layer is disposed between the second optical filter and the first substrate in a direction perpendicular to the first substrate and overlaps the second optical filter.

15. The display device of claim 13, wherein the first protective insulating layer is partially disposed inside the second opening.

16. The display device of claim 15, further comprising:
    a second substrate overlapping each of the first optical filter and the second optical filter;
    a first color filter disposed between the second substrate and the first optical filter; and
    a second color filter disposed between the second substrate and the second optical filter.

17. The display device of claim 16, wherein the second color filter overlaps the second optical filter and includes a first filter opening, wherein the first filter opening exposes a portion of the second substrate, and wherein the portion of the second substrate overlaps the first optical filter.

18. The display device of claim 17, wherein the first color filter is partially disposed inside the first filter opening and includes a second filter opening, wherein the second filter opening exposes a portion of the second color filter, and wherein the portion of the second optical filter is disposed between the second filter opening and the second substrate.

19. The display device of claim 18, further comprising a second protective insulating layer disposed between the first color filter and the first optical filter and disposed between the second color filter and second optical filter.

20. The display device of claim 19, wherein a first section of the first protective insulating layer and a first section the second protective insulating layer overlap each other and are spaced from each other by the first optical filter, and wherein a second section of the first protective insulating layer and a second section of the second protective insulating layer directly contact each other and are positioned between the second color filter and the second optical filter.

21. The display device of claim 1, wherein the first optical filter is formed using an inkjet process, and wherein the second optical filter is formed using a photolithography process.

* * * * *